United States Patent [19]

Barth, Jr. et al.

[11] Patent Number: 5,134,616
[45] Date of Patent: Jul. 28, 1992

[54] DYNAMIC RAM WITH ON-CHIP ECC AND OPTIMIZED BIT AND WORD REDUNDANCY

[75] Inventors: John E. Barth, Jr., South Burlington; Charles E. Drake; John A. Fifield, both of Underhill, all of Vt.; William P. Hovis, Rochester, Minn.; Howard L. Kalter, Colchester, Vt.; Scott C. Lewis, Essex Junction, Vt.; Daniel J. Nickel, Westford, Vt.; Charles H. Stapper, Jericho, Vt.; James A. Yankosky, Essex Junction, Vt.

[73] Assignee: International Business Machines Corporation, Armonk, N.Y.

[21] Appl. No.: 479,145

[22] Filed: Feb. 13, 1990

[51] Int. Cl.$^5$ .............................................. G06F 11/00
[52] U.S. Cl. .................................. 371/10.3; 371/10.2
[58] Field of Search ................ 371/10.3, 10.2, 10.1, 371/51.1; 365/230.03, 200

[56] References Cited

U.S. PATENT DOCUMENTS

| | | | |
|---|---|---|---|
| Re. 32,708 | 7/1988 | Itoh | 365/189 |
| 3,387,286 | 6/1968 | Dennard | 340/173 |
| 3,714,637 | 1/1973 | Beausolell | 340/173 R |
| 3,735,368 | 5/1973 | Beausolell | 340/173 R |
| 3,753,244 | 8/1973 | Sumilas et al. | 340/172.5 |
| 3,755,791 | 8/1973 | Arzubi | 340/173 R |
| 3,781,826 | 12/1973 | Beausolell | 340/173 R |
| 4,335,459 | 6/1982 | Miller | 371/38 |
| 4,380,066 | 4/1983 | Spencer et al. | 371/10.1 |
| 4,493,081 | 1/1985 | Schmidt | 371/37.3 |
| 4,570,084 | 2/1986 | Griffin et al. | 307/452 |
| 4,654,849 | 3/1987 | White et al. | 371/21 |
| 4,688,219 | 9/1987 | Takemae | 371/10 |
| 4,726,021 | 2/1988 | Horiguchi et al. | 371/38 |
| 4,754,433 | 6/1988 | Chin et al. | 365/189 |
| 4,763,302 | 8/1988 | Yamada | 365/189 |
| 4,764,901 | 8/1988 | Sakurai | 365/189 |
| 4,768,193 | 8/1988 | Takemae | 371/10.3 |
| 4,801,988 | 1/1989 | Kenney | 357/23.6 |
| 4,817,052 | 3/1989 | Shinoda et al. | 365/104 |
| 4,831,597 | 5/1989 | Fuse | 365/233 |
| 4,845,664 | 7/1989 | Aichelmann et al. | 364/900 |
| 4,847,810 | 7/1989 | Tagami | 371/10.1 |
| 4,860,260 | 8/1989 | Saito et al. | 371/10.3 |

(List continues on next page.)

OTHER PUBLICATIONS

"A Built-In Hamming Code ECC Circuit for DRAM's", Furutani et al., IEEE Journal of Solid-State Circuits, vol. 24, No. 1, Feb. 1989, pp. 50-56.

(List continued on next page.)

Primary Examiner—Jerry Smith
Assistant Examiner—Phung Chung
Attorney, Agent, or Firm—Mark F. Chadurjian

[57] ABSTRACT

A DRAM having on-chip ECC and both bit and word redundancy that have been optimized to support the on-chip ECC. The bit line redundancy features a switching network that provides an any-for-any substitution for the bit lines in the associated memory array. The word line redundancy is provided in a separate array section, and has been optimized to maximize signal while reducing soft errors. The array stores data in the form of error correction words (ECWs) on each word line. A first set of data lines (formed in a zig-zag pattern to minimize unequal capacitive loading on the underlying bit lines) are coupled to read out an ECW as well as the redundant bit lines. A second set of data lines receive the ECW as corrected by bit line redundancy, and a third set of data lines receive the ECW as corrected by the word line redundancy. The third set of data lines are coupled to the ECC block, which corrects errors encountered in the ECW. The ECC circuitry is optimized to reduce the access delays introduced by carrying out on-chip error correction. The ECC block provides both the corrected data bits and the check bits to an SRAM. Thus, the check bits can be externally accessed. At the same time, having a set of interrelated bits in the SRAM compensates for whatever access delays are introduced by the ECC. To maximize the efficiency of switching from mode to mode, the modes are set as a function of received address signals.

36 Claims, 15 Drawing Sheets

U.S. PATENT DOCUMENTS

| | | | |
|---|---|---|---|
| 4,901,320 | 2/1990 | Sawada et al. | 371/51.1 |
| 4,908,798 | 3/1990 | Urai | 365/250.03 |
| 4,999,815 | 3/1991 | Barth, Jr. et al. | 365/230 |
| 5,015,880 | 5/1991 | Drake et al. | 307/443 |

OTHER PUBLICATIONS

"Cost Analysis of On-Chip Error Control Coding for Fault Tolerant Dynamic RAMs", Jarwala et al., The Computer Society of the IEEE, Proceedings of the Seventeenth International Symposium on Fault-Tolerance Computing, Jul. 6-8, 1987, pp. 278-283.

"Circuit Technologies for 16 Mb DRAMs", Mano et al., 1987 IEEE International Solid-State Circuits Conf., pp. 22-25.

"Design of a Fault-Tolerant DRAM with New On--Chip ECC", P. Mazumder, Center for Research on High-Frequency Microelectronics Dept. of EE and Comp. Sci., University of Michigan pp. 2.4-1-2.4-8.

"A Novel Fault-Tolerant Design of Testable Dynamic Random Access Memory", Mazumder et al., IEEE 1987, pp. 306-309.

"Selector-Line Merged Build-In ECC Technique for DRAM's", J. Yamada, IEEE Journal of Solid-State Circuits, vol. SC-22-No. 5, Oct. 1987.

"A 4-Mbit DRAM with 16-bit Concurrent ECC", Yamada et al., IEEE Journal of Solid-State Circuits, vol. 23, No. 1, Feb. 1988 pp. 20-25.

"Single-Event Upset (SEU) In a DRAM with On-Chip Error Correction", Zoutendyk et al., IEEE Transactions on Nuclear Science, vol. NS-34, No. 6, Dec. 1987 pp. 1310-1316.

"Internal Correction of Errors in a DRAM", NASA's Jet Propulsion Laboratory, NASA Tech Briefs, Dec. 1989, pp. 30-31.

DYNAMIC RAM WITH ON-CHIP ECC AND OPTIMIZED BIT AND WORD REDUNDANCY

BACKGROUND OF THE INVENTION

1. Technical Field

The invention relates generally to the field of dynamic random access memory (DRAM) design, and more particularly to a DRAM architecture that optimizes the combination of on-chip error correction code (ECC) circuitry, bit line redundancy, and word line redundancy, so as to optimize the ability of the DRAM to correct different types of errors.

2. Background Art

From the very early stages of DRAM development in the 1970's, designers have recognized the need for some sort of on-chip error recovery circuitry. That is, given the large number of processing steps needed to make a memory chip, and given the large number of discrete transistor-capacitor memory cells to be fabricated, from a practical standpoint it is inevitable that at least some memory cells will not function properly.

One of the first on-chip error recovery techniques utilized in the industry was the general idea of redundancy. In redundancy, one or more spare lines of cells are added to the chip. These can be either spare word lines (i.e. lines of cells having their FET gate electrodes interconnected) or spare bit lines (i.e. lines of cells having their FET drain electrodes interconnected on a common line coupled to a sense amplifier that senses the state of the selected memory cell). Typically, a standard NOR address decoder is provided for each redundant line. After the memory chip is manufactured, it is tested to determine the addresses of faulty memory cells. These addresses are programmed into the address decoder for the redundant lines, by controllably blowing fuses, setting the state of a RAM or EEPROM, etc. When the address sent to the memory chip is for the line on which the faulty cell resides, the address decoder for the redundant line activates the redundant line instead. In this manner, if discrete cells in the memory chip are inoperative, redundant cells can be substituted for them. Among the earliest patents directed to redundancy are U.S. Pat. No. 3,753,244, entitled "Yield Enhancement Redundancy Technique," issued Aug. 28, 1973 to Sumilas et al and assigned to IBM (word line redundancy), and U.S. Pat. No. 3,755,791, entitled "Memory System With Temporary or Permanent Substitution of Cells For Defective Cells," issued Aug. 28, 1973 to Arzubi and assigned to IBM (bit line redundancy).

One of the drawbacks associated with redundancy is that it can only rectify a relatively small amount of faulty random cells. That is, as the number of faulty cells increases, the number of redundant lines needed to correct these cells increases, to the point where you have a large amount of spare memory capacity that ordinarily is not used (and may itself incorporate faulty cells, such that you need even more redundant lines to correct errors in the remaining redundant lines). Therefore, typically a relatively small amount of redundant lines are provided on-chip, such that if an entire subarray or array of cells is faulty, redundancy can no longer be used for correction.

This problem is addressed by the use of partially-good chips. Two or more chips having large amounts of faulty cells are mounted and stacked together in a multichip package. In one technique, the chips are selected such that they complement one another in terms of which arrays are good and which arrays are faulty. For example, if a given array on a first memory chip is bad, a second chip is selected wherein that same array is good. Thus, the two partially-good chips operate as one all-good chip. See U.S. Pat. No. 3,714,637, entitled "Monolithic Memory Utilizing Defective Storage Cells"; U.S. Pat. No. 3,735,368, entitled "Full Capacity Monolithic Memory Utilizing Defective Storage Cells"; and U.S. Pat. No. 3,781,826, "Monolithic memory utilizing Defective Storage Cells", all issued to W. Beausoleil and assigned to IBM.

Over time, some workers in the art have come to understand that the error recovery techniques discussed may not efficiently rectify all of the possible errors that may occur during DRAM operation. Specifically, a memory cell that initially operates properly may operate improperly once it is in use in the field. This may be either a so-called "soft error" (e.g. a loss of stored charge due to an alpha particle radiated by the materials within which the memory chip is packaged) or a "hard error" (a cycle-induced failure in the metallization or other material in the chip that occurs after prolonged use in the field). Because both of these types of errors occur after initial testing, they cannot be corrected by redundancy or by the use of partially-good chips. In general, this problem has been addressed by the use of error correction codes (ECC) such as Hamming codes or horizontal-vertical (HV) parity. These techniques are typically used in larger computer systems wherein data is read out in the form of multi-bit words.

The Hamming ECC double error detect, single error correct (DED/SEC) system of the prior art will now be briefly described. The data is stored as an ECC word having both data bits and check bits. The check bits indicate the correct logic states of the associated data bits. The ECC logic tests the data bits using the check bits, to generate syndrome bits indicating which bits in the ECC word are faulty. Using the syndrome bits, the ECC logic then corrects the faulty bit, and the ECC word as corrected is sent on to the processor for further handling.

As previously stated, in the prior art ECC circuitry was typically used in large systems and embodied in separate functional cards, etc. While this type of system-level ECC is now being used in smaller systems, it still adds a degree of both logic complexity and expense (due to added circuit cost and decreased data access speed) that makes it infeasible for less complicated systems. In these applications, memory performance/reliability suffers because there is no system-level ECC to correct for errors that occur after initial test.

The solution to this problem is to incorporate ECC circuitry on the memory chip itself. This reduces the expense associated with ECC, while at the same time increasing the effective memory performance. U.S. Pat. No. 4,335,459, entitled "Single Chip Random Access Memory With Increased Yield and Reliability," issued Jun. 15, 1982 to Miller, relates to the general idea of incorporating Hamming code ECC on a memory chip. The stored data is read out in ECC words consisting of 12 bits (8 data bits, 4 check bits) that are processed by the ECC circuitry. The corrected 8 data bits are sent to an 8-bit register. The register receives address signals that select one of the 8 bits for output through a single bit I/O. U.S. Pat. No. 4,817,052, entitled "Semiconductor memory With An Improved Dummy Cell Arrangement And With A Built-In Error Correcting Code Circuit,"

issued 3/28/89 to Shinoda et al and assigned to Hitachi, discloses a particular dummy cell configuration as well as the general idea of interdigitating the word lines so that adjacent failing cells on a word line will appear as singlebit fails (and thus be correctable) by the ECC system, because they will appear in different ECC words.

Yet other workers have recognized that the optimum solution to error correction is to incorporate both ECC circuitry and redundancy on the same memory chip. Examples of such arrangements include U.S. Pat. No. 4,688,219, entitled "Semiconductor Memory Device Having Redundant Memory and Parity Capabilities," issued Aug. 18, 1987 to Takemae and assigned to Fujitsu (bit line redundancy incorporated with HV parity by use of a switching circuit that generates the parity bits for the redundant column line separately from the generation of the parity bits for the remaining cells); U.S. Pat. No. 4,768,193, issued Aug. 30, 1988 to Takemae and assigned to Fujitsu (an array contiguous to the main memory array provides both word line and bit line redundancy for an HV ECC system, wherein fuses are used to disconnect the faulty word line and/or bit line from the horizontal and/or vertical parity generators, respectively); and an article by Furutani et al, "A Built-In Hamming Code ECC Circuit for DRAM's," IEEE Journal of Solid-State Circuits, Vol. 24, No. 1, Feb. 1989, pp. 50–56 (new ECC circuitry for an on-chip Hamming code system, with redundancy the article does not discuss redundancy in any detail).

In all of the above references, bit line and word line redundancy techniques are used that are not optimized for on-chip ECC. In the '219 Takemae patent, conventional bit line redundancy is used, with separate parity generation for the redundant line. In the '193 Takemae patent, a single array provides both bit line and word line redundancy. Since Furutani does not describe a redundancy system, it appears that he simply assumes that conventional redundancy can be used. This assumption is not incorrect; as shown by the Takemae patents, conventional redundancy techniques can be used. However, we have found that as a practical matter conventional redundancy will decrease the overall effectiveness of the total error correction system. For example, by having one array provide both bit and word redundancy, the error correction system itself becomes more susceptible to errors, because the redundant cells are physically all in one place. Moreover, the use of ideas such as fuses to physically disconnect the faulty main memory rows/columns from the ECC circuitry, and/or incorporating an entirely separate set of ECC circuitry for the redundant elements, adds extra logic to the design that takes up more room on the chip while adding yet another failure mechanism.

Also, none of these references take into account the use of ECC as a tool to aid in process learning during the early stages of design and development of a memory chip. Due to the complexity and uniqueness of the myriad of process steps that make up a given manufacturing process for a memory chip, when the chips are first being made (i.e., early in the production cycle) many different failure mechanisms are encountered. At this early stage, it is critical to produce some sort of working hardware that can be tested, so as to gain a greater understanding of these failure mechanisms. ECC can be used as a tool to gain a greater appreciation of these mechanisms, because it can be used to rectify a large quantity of errors, both hard and soft. However, later in the production cycle of the chip, sufficient process learning may occur such that the number of errors is greatly reduced. In this situation, it may be advisable to completely do away with the ECC system, so as to reduce the chip size and increase access speeds. In the prior art, no provision is made for designing the overall chip architecture such that the ECC system can be deleted from product chips without a major redesign of the support circuitry.

Accordingly, a need exists in the art for a memory chip architecture that incorporates redundancy (as well as other features) optimized for on-chip ECC. Moreover, there is a need in the art for a memory architecture that supports early process learning, without increasing expense while decreasing performance of memory chips made in production volumes.

SUMMARY OF THE INVENTION

It is thus an object of the invention to provide redundancy systems that have a reduced sensitivity to defects, etc. occurring in the memory arrays.

It is another object to efficiently combine both bit line redundancy and word line redundancy that have been optimized to support on-chip ECC.

It is yet another object of the invention to provide a data line configuration for efficiently switching redundant bit lines for the bit lines of the memory array.

It is yet another object of the invention to configure the on-chip ECC system so as to minimize access delays.

It is yet another object of the invention to provide a pipelined layout that simplifies the integration of on-chip ECC at minimum access penalty.

It is yet another object for the invention to provide a buffer means for receiving an entire error correction word from on-chip ECC, and for providing data bits therefrom in an efficient manner.

It is yet another object of the invention to efficiently set the operational mode by which data will be obtained.

It is a further object of the invention to provide a memory chip architecture that supports ECC circuitry that is used to support process learning in the early stages of manufacture.

The above and other objects of the invention are realized by a dynamic random access memory, comprising at least one array of memory cells comprising a plurality of word lines, a plurality of bit lines, and a plurality of redundant bit lines, switching means for substituting any one of said plurality of redundant bit lines for any one of said plurality of bit lines in said array, a separate array of redundant word lines, address means for accessing an error correction word comprising data bits and check bits from said array of memory cells or said array of redundant word lines, error correction circuitry coupled to said plurality of word lines, said plurality of bit lines, said plurality of redundant bit lines, and said separate array of redundant word lines, for reading said accessed error correction word therefrom and correcting any faulty data bits therein, and output means for providing said data bits as corrected by said error correction circuitry for external read-out.

Another aspect of the invention comprises a manufacturing process for forming wafers having a plurality of memory chips thereon, each of the memory chips comprising both a number X of memory cells and a number Y of redundant cells that can be substituted for selected ones of said memory cells that are faulty, and support circuitry for writing data into and reading data out of the array of memory cells, the process having a production cycle associated therewith that is a function of the number N of memory cells that are faulty after production thereof, a method for manufacturing said memory chips, comprising the steps of early in said production cycle, providing an error correction code circuit block to the support circuitry of each memory chip, and disposing said circuit block within an area that extends from one side of the memory chip to the other, said area not having any other support circuitry associated therewith, and later in said production cycle, when said number N of faulty memory cells produced by said process is approximately the same as or less than the number Y of redundant cells, deleting said error correction code circuit block from memory chips manufactured by the process at that time.

Yet another aspect of the invention comprises a memory chip, comprising an array of memory cells interconnected by a plurality of word lines and a plurality of bit lines, a plurality of redundant bit lines, means for simultaneously addressing a first predetermined number of said plurality of bit lines so as to access a multi-bit word, while also simultaneously addressing a second predetermined number of said plurality of redundant bit lines, a first plurality of data lines coupled to at least said first predetermined number of said plurality of bit lines and to said second predetermined number of said plurality of redundant bit lines, a second plurality of data lines, wherein there are more of said second plurality of data lines than there are of said first plurality of data lines, and switching means for substituting one or more of said second predetermined number of said plurality of redundant for any one or more of said first predetermined number of said plurality of bit lines, and providing a signal from said substituted redundant bit line as a respective bit of said multi-bit word.

Yet another aspect of the invention comprises a memory array formed on a substrate having a plurality of memory cells interconnected by a plurality of word lines disposed in a first direction, and a plurality of bit lines disposed over said plurality of word lines in a second direction substantially orthogonal to said first direction, a plurality of data lines disposed in a zig-zag pattern over said plurality of bit lines in said second direction, so as to minimize capacitive coupling between said data lines and said bit lines.

Yet another aspect of the invention comprises a memory chip, comprising a first array of memory cells disposed on a first portion of said chip, said memory cells being interconnected by a plurality of bit lines and a plurality of word lines, said array including a plurality of sense amplifiers coupled to said plurality of bit lines to sense a differential signal of a first magnitude therefrom to read respective ones of said memory cells, a second array of redundant cells disposed on a second portion of said chip spaced from said first portion thereof, said redundant cells being interconnected by a plurality of bit lines and a plurality of word lines, said second array including a plurality of sense amplifiers coupled to said plurality of bit lines to sense a differential signal of a second magnitude greater than said first magnitude therefrom to read respective ones of said redundant cells.

Yet another aspect of the invention comprises a memory that supports a plurality of operational modes, the memory having a first plurality of inputs for receiving a respective plurality of external control signals, and a second plurality of address inputs for receiving first address signals that normally indicate the address of a given memory cell to be accessed, a method of setting the operational mode for a given memory access cycle, comprising receiving at least one of said plurality of external control signals during a given memory access cycle, and determining therefrom a time period during said given memory access cycle when said second plurality of address inputs will not receive said first address signals, accessing said second plurality of address inputs during said time period to receive second address signals that indicate that the memory is to be operated in one of said plurality of operational modes during said given memory access cycle, and decoding said second address signals to set the memory to said one of said plurality of operational modes for said given memory cycle, and maintaining said memory in said one of said plurality of operational modes until such time as a new operational mode is set.

BRIEF DESCRIPTION OF THE DRAWING

The foregoing and other structures and teachings of the invention will become more apparent upon describing the best mode for carrying out the invention, as rendered below. In the description to follow, reference will be made to the accompanying Drawing, in which.

DESCRIPTION OF THE BEST MODE FOR CARRYING OUT THE INVENTION

Figure 1:
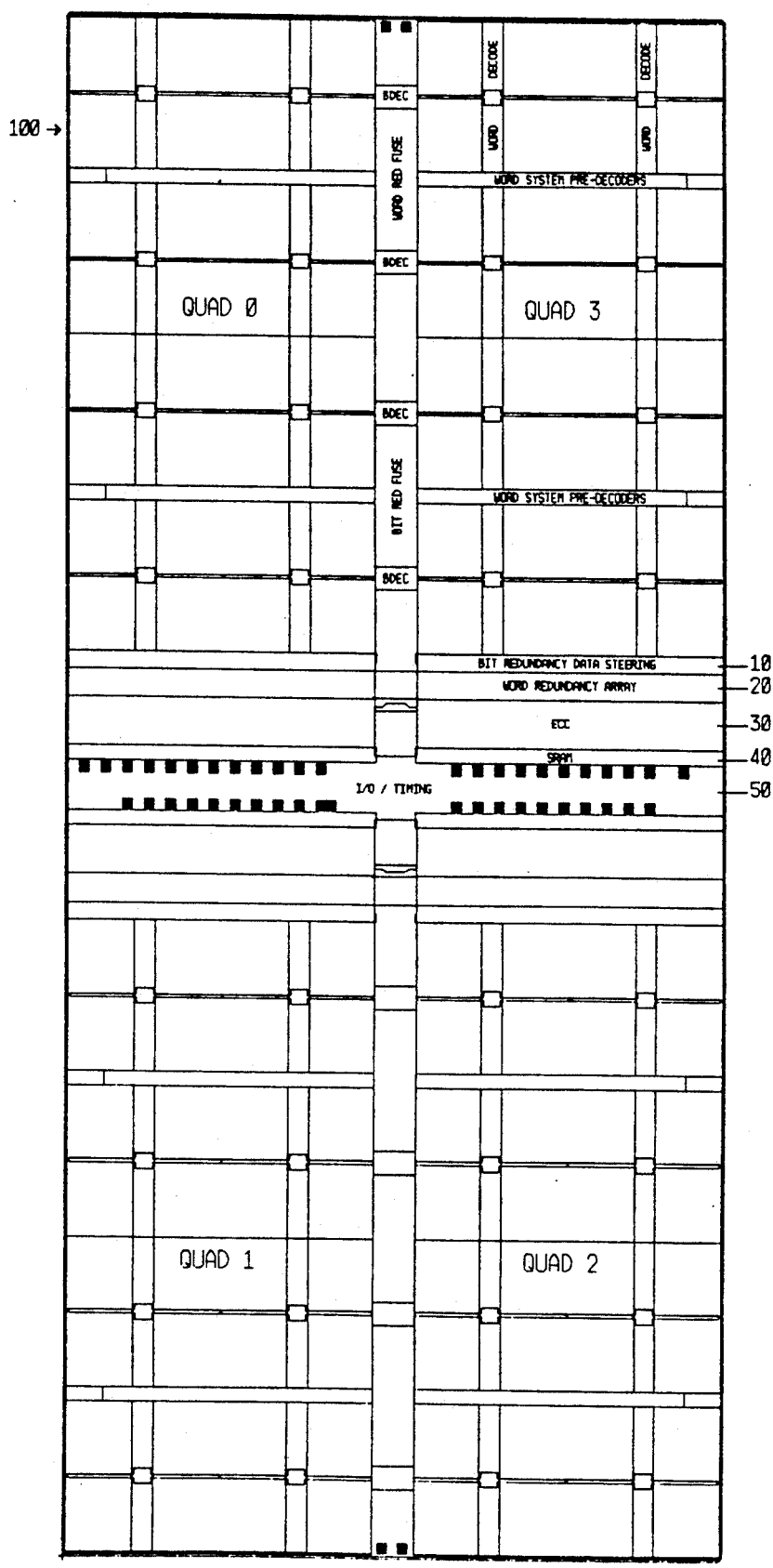
FIG. 1 is a top view of a memory chip layout incorporating the memory chip architecture of the invention.

As shown in FIG. 1, the memory chip 100 of the invention comprises four quadrants QUAD0-QUAD3.

As described in more detail below, each quadrant has approximately four million storage cells (4 Mb). Thus, the chip has approximately 16 million bits (16 Mb) of cells. The memory cells are of the conventional "one device" DRAM type (i.e. an FET having its gate coupled to a word line, its drain coupled to a bit line, and its source coupled to the storage capacitor, wherein a sense amplifier coupled to the bit line compares the voltage from the capacitor to a reference voltage from a reference cell to determine the stored logic state), as generally described in U.S. Pat. No. 3,387,286 issued June 1968 to Dennard and assigned to IBM. Although the cells can be construed using any one of a number of known techniques, it is preferred that substrate-plate cells be used (wherein the storage plate of the storage capacitor is formed by doped poly disposed in a trench that extends through epitaxial layers to the underlaying substrate that forms the charge plate—see U.S. Pat. No. 4,801,988, issued Jan. 1989 to Kenney and assigned to IBM, the teachings of which are incorporated herein by reference). It should be appreciated that while this chip architecture will be described with reference to 16 Mb, it can be applied to a memory chip of any density.

Each quadrant has unique support circuitry disposed between the arrays and the I/O pads 50. This circuitry includes the bit redundancy data steering 10, the word redundancy array 20, error correction circuitry 30, and an SRAM 40. In general, as will be described in more detail below, these functional blocks are disposed in a "pipelined" mode; that is, their placement mimics the general order in which they carry out their respective logic functions. The ECC 30 receives inputs from either the memory cells of QUAD 3 or the word redundancy array 20, and provides corrected bits to the SRAM 40, which in turn provides selected bits to the I/O pads 50. By disposing the logic in a pipelined mode, both the layout of the functional blocks is simplified and the performance delays associated with long wires running from one logic block to the next are minimized. This is especially important in incorporating on-chip ECC, in order to minimize the added access delay associated with this circuitry.

The remaining peripheral circuits (e.g. address decoders, buffers, clock generators, etc.) are located vertically and horizontally thru the center of the chip to optimize chip performance and reliability. The I/O pads 50 are located in the center of the chip such that signals are transmitted to the respective peripheral circuits and arrays across only one half the chip length to obtain a minimum RC wiring delay. Also, all external I/O signals are separately buffered for each quadrant (i.e., each quadrant has its own buffers) to both reduce capacitance loading and isolate chip areas to enhance piece part reliability. Thus, each quadrant QUAD-0-QUAD3 runs as a totally separate 4 Mb chip.

Figure 2:
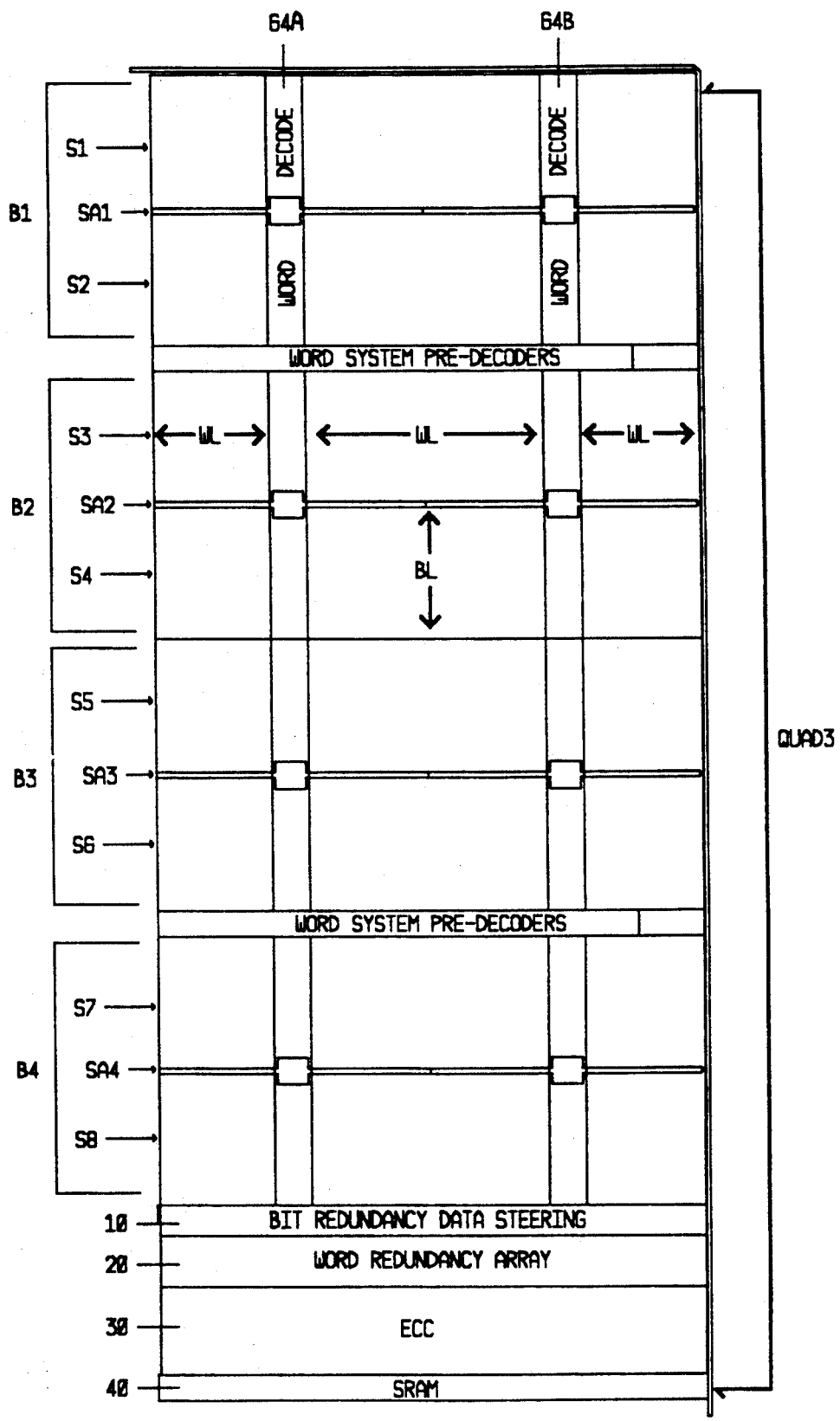
FIG. 2. is an enlarged view of one of the quadrants of the memory chip of FIG. 1.

FIG. 2 is an expanded view of QUAD 3 of FIG. 1. Each quadrant is broken down into four one megabit blocks B1-B4, each of which consists of two segments of 512 Kb of memory cells. Thus each quadrant has eight segments S1-S8. Each quadrant comprises 4096 word lines (the layout of the word lines being indicated by the arrows WL). Each segment S1-S8 has 1112 bit line pairs, the layout within a respective segment being indicated by the arrows BL. Each block B1-B4 has its own set of sense amplifiers SA1-SA4, which are physically located between the respective segments of each block. The address decoders for the word lines are made up of the parts: word system pre-decoders 62A, 62B running across the chip that select a group of word lines, and 4096 word decoders 64A, 64B running up and down the chip that select two of the 4096 word lines in the quadrant. As shown in FIG. 1, the bit decoders BDEC are disposed in the center of the chip, and contain two identical independent decoders coupled to respective blocks of adjacent quadrants. In practice, all of these decoders are of the standard NOR-node type.

Figure 3:
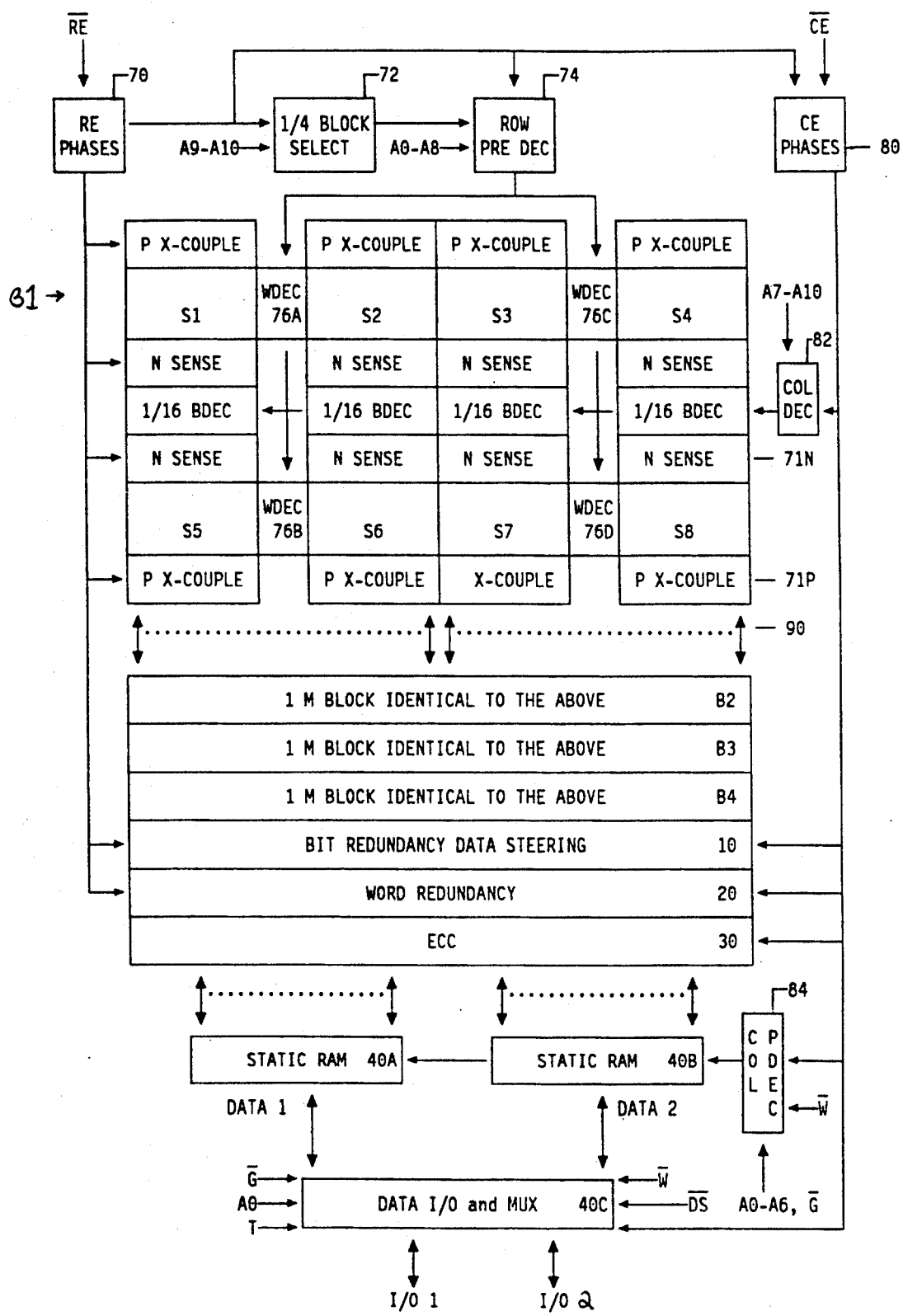
FIG. 3 is a block diagram of the memory architecture of the invention.

FIG. 3 is a logic diagram showing the overall operation and interdependences of the functional blocks of FIGS. 1 and 2. The external row enable phase (RE) goes low to initiate the operation of the chip by starting internal clock generators RE PHASES 70 associated with word line decoding. One of these signals enables a block select 72, which receives the least significant addresses A9 and A10 from the address buffers and true/complement generators (not shown) on-chip. The block select selects a group of 1024 out of the 4096 word lines in each quadrant. The block select provides an enable signal E that only enables the predecoders 74 and one of the decoders in each 76A-76D associated with each 512 word lines in the selected block. Both the predecoders and decoders decode address signals A0-A8, to select a word line in each of two 512 word line segments.

Figure 4:
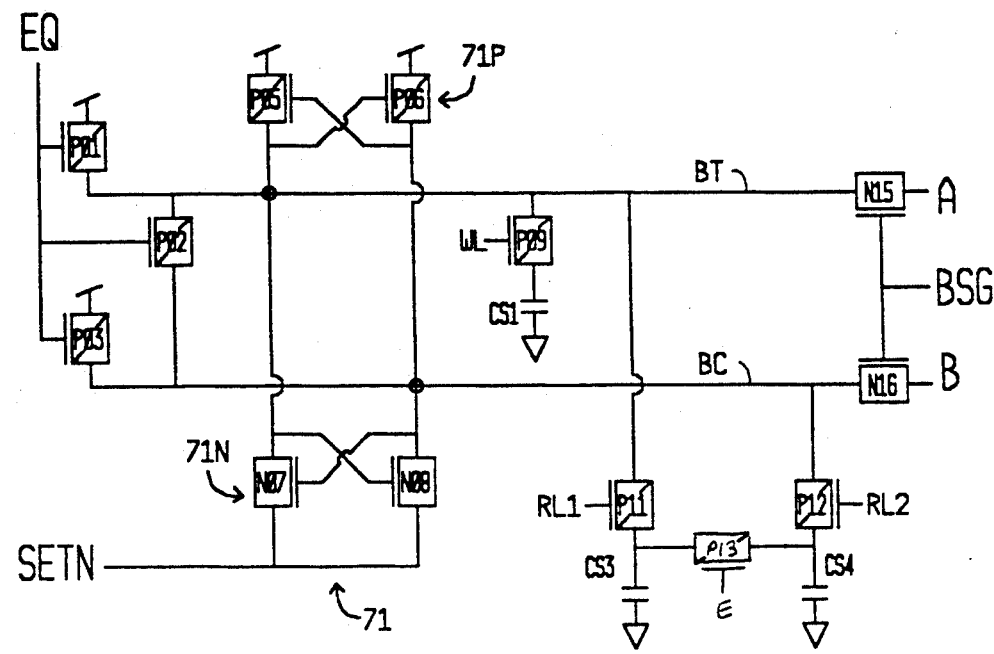
FIG. 4 is a circuit schematic of a bit line pair in the memory array of the invention.

FIG. 4 shows a detailed circuit diagram of the sense system of the invention. The voltage on selected word line WL falls, turning on the PMOS FET P09. As a result, the charge stored by capacitor CS1 is transferred to bit line BT. The bit lines are of the folded bit line type described in U.S. Pat. RE No. 32,708, reissued July, 1988 to Itoh and assigned to Hitachi. This means that the sense amplifier is coupled to two adjacent bit lines BT and BC; in our example, the reference word line RL2 will fall, to provide a reference voltage to bit line BC. After word line WL has fallen, signal SETN from the RE PHASES 70 will fall, setting the n-latch 71N and the p-latch 71P of the sense amplifier 71. The n-latch 71N drives bit lines BT and BC to opposite (high-low) states, as a function of the charge stored in the selected memory cell. The p-latch 71P will keep the bit lines latched at their high-low voltages.

Referring back to FIG. 3, note that this operation is occurring in all 1112 bit line pairs (including redundant bit lines, as discussed below) within the quadrant The next major step is to perform a bit line decode operation. The decode includes two major components. When external clock column enable CE falls, the bit decode operation begins. Of the eleven address bits provided at that time, the most significant bits A7-A10 are decoded by column decoder 82. Column decoder 82 provides a 1/16 decode, to select 139 out of the 1112 bit line pairs in each quadrant. Thus, referring back to FIG. 4, 139 pairs of bit lines BT, BC will be coupled to data lines by virtue of the BSG signal rising, which turns on pass transistors N15, N16 that couple the bit lines to the data lines (not shown in FIG. 4). After redundancy substitution and error correction, 128 bits as corrected by the ECC 20 are stored by the SRAMs 40A, 40B. Remaining address bits A1-A6 are decoded by column pre-decoder 84 to select two out of the 128 bits (one from each SRAM 40A, 40B). Finally, address bit A0 is decoded by the DATA I/O AND MUX block 40C, to provide one of the two bits to the output I/O1. Alternatively, this final decode could not be carried out, and both bits could be supplied via a second output pin I/O 2. Alternatively, as described in detail in U.S. Pat. No. 4,845,664, (issued July, 1989 to Aichelmann, Jr. et al and assigned to IBM, the teachings of which are incorporated herein by reference) both bits could be sent out a single pin I/O 1 in a sequential fashion, under the control of signal T (indicating this output mode) and DS (indicating which bit of the two is to be outputted first for that quadrant).

In the foregoing description, the chip was addressed using 11 row address bits and 11 column address bits (11/11) As described in co-pending U.S. Pat. No. 4,999,815, entitled, "Low Power Addressing Systems," filed Feb. 12, 1990, by J. Barth et al and assigned to IBM, the chip can also be addressed using 12/10 addressing.

Figure 6:
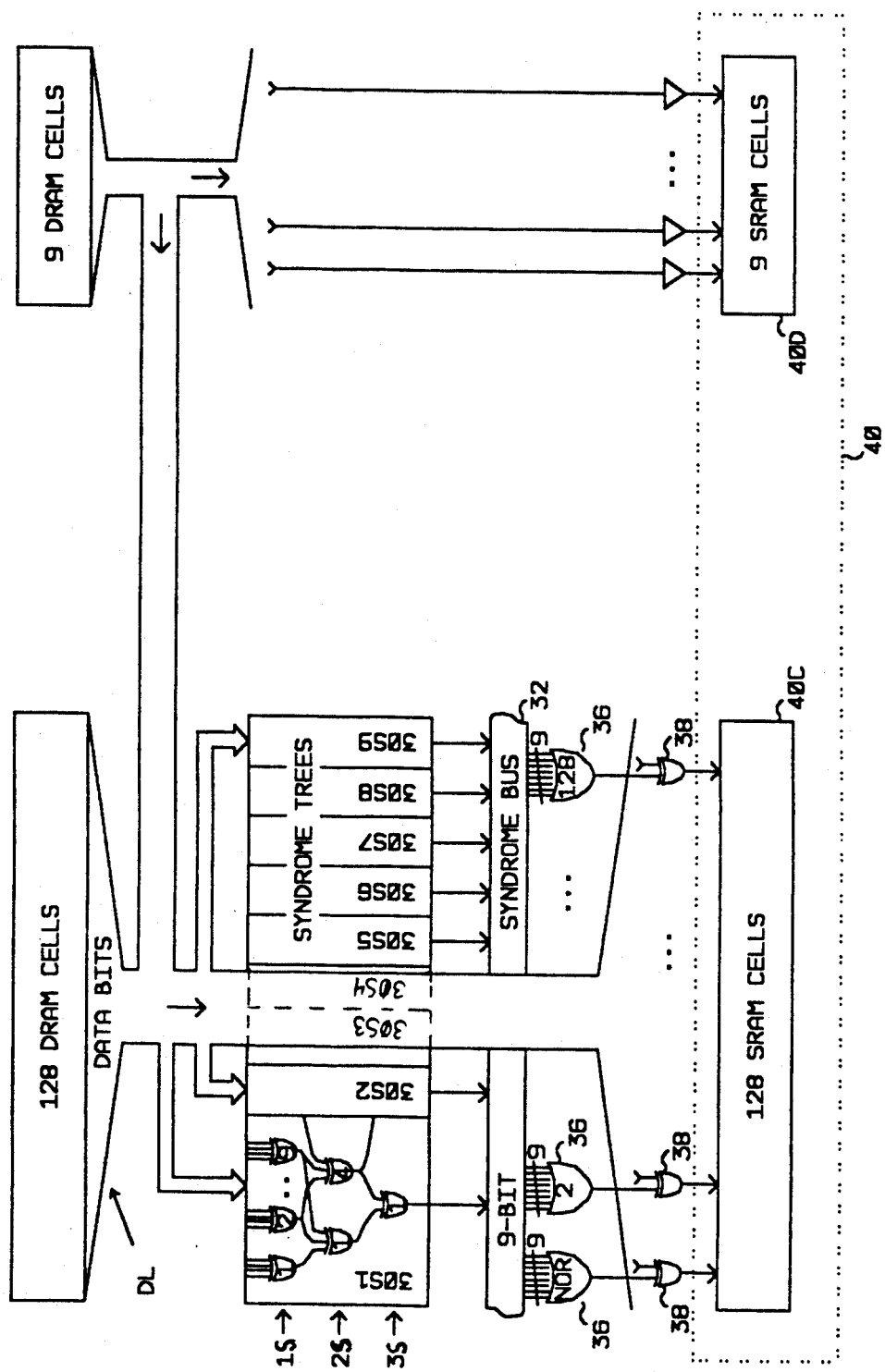
FIG. 6 is a block diagram of the ECC system of the invention, showing a fetch operation.
Figure 7:
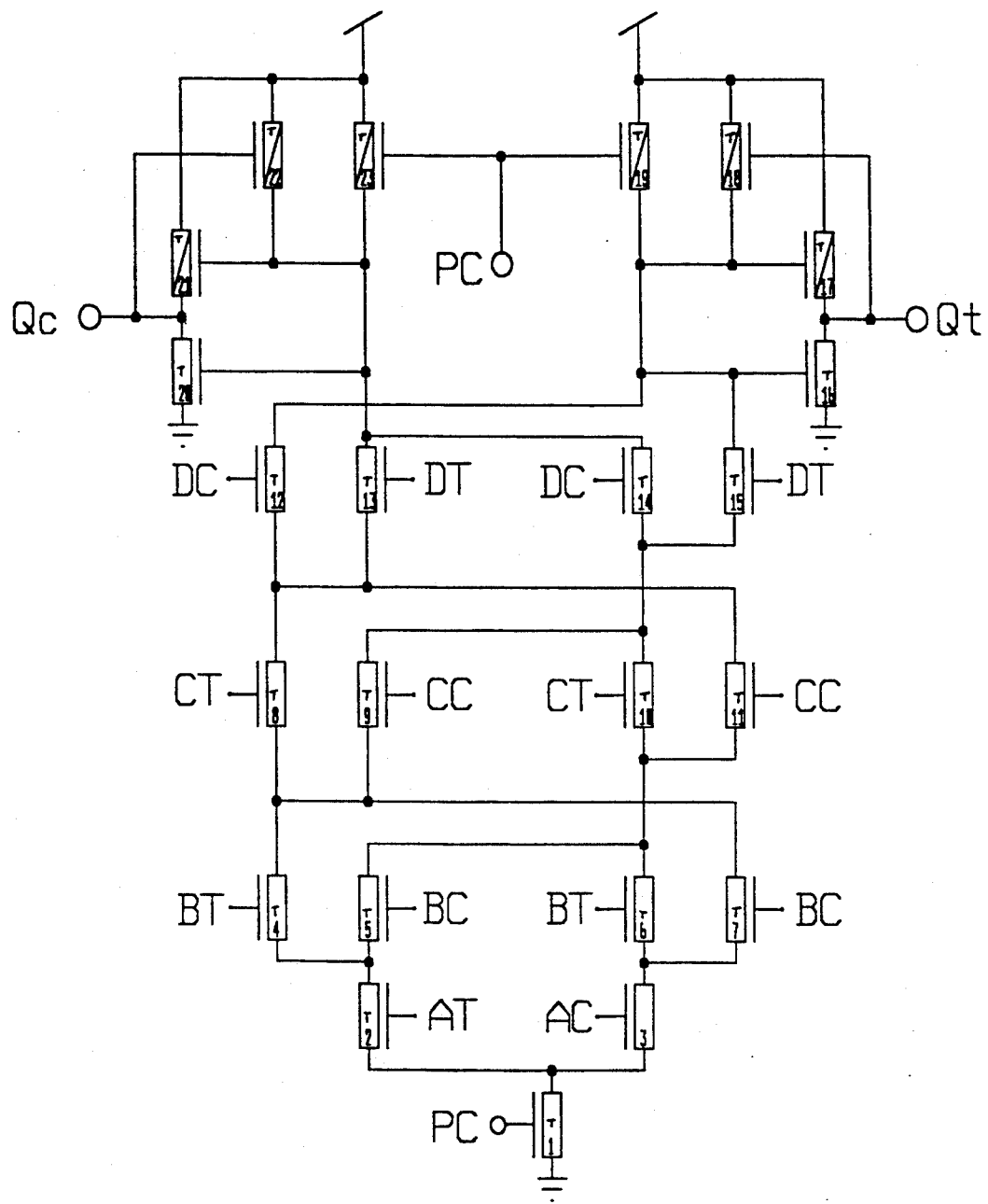
FIG. 7 is a circuit diagram of a four-input DCVS XOR utilized in the ECC system of FIGS. 5 and 6.

Since many of the features of the memory chip architecture of the invention are a function of the on-chip ECC, a description of the system will now be made with reference to FIGS. 5-7.

All of the read or write cycles of the invention begin with a "fetch" operation (wherein data is transferred from the DRAM through the ECC to the SRAM) and end with a "write-back" operation (wherein data is transferred from the SRAM through ECC to the DRAM).

The ECC block 30 utilizes an odd-weight Hamming code, which provides a double error detect, single error correct (DED/SEC) capability. While other codes (e.g., horizontal-vertical parity) could be used, odd-weight Hamming code is preferred because it provides the best error coverage at the lowest cost (for a more detailed comparison between odd-weight ECC codes and other codes, see the article by N. Jarwala et al entitled "Cost Analysis of On Chip Error Control Coding for Fault Tolerant Dynamic RAMs," Proceedings of the Seventeenth International Symposium on Fault-Tolerant Computing, Pittsb. Pa, July 6-8 1987, pp. 278-283). In the invention, a data word of 128 bits is used, requiring nine check bits, for a total error correction word (ECW) of 137 bits.

Figure 5:
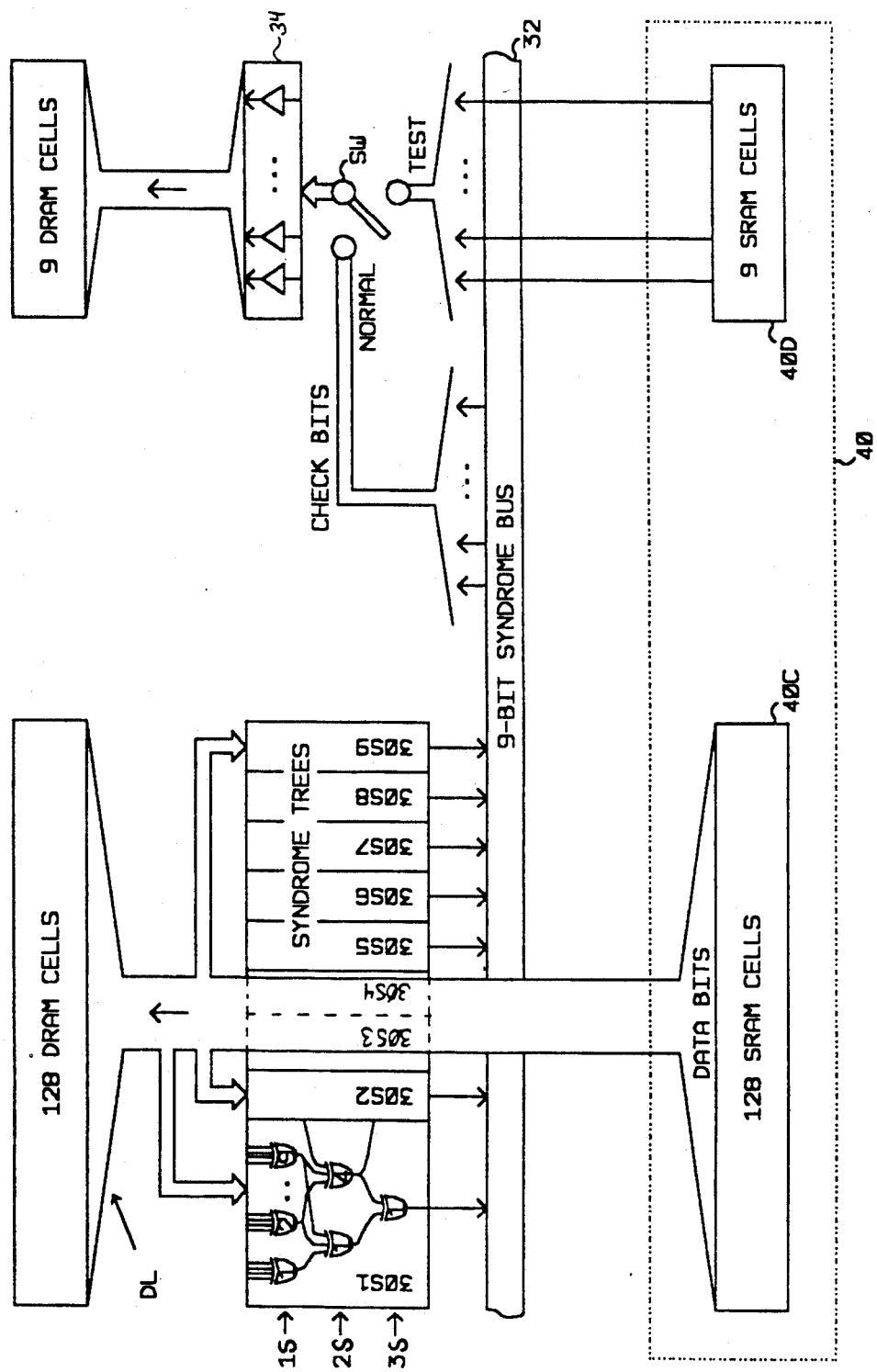
FIG. 5 is a block diagram of the ECC system of the invention, showing a writeback operation.

As shown in FIG. 5, the ECC block 30 is made up of nine syndrome generators 30S1-30S9. As shown within syndrome generator 30S1, each generator is made up of three stage exclusive-OR (XOR) logic trees. The first stage 1S of the logic tree is made up of a first set of four-input XOR gates; the second stage 2S is made up of approximately four four-input XOR gates; and the final stage 3S is a single four-input XOR gate. Note that the syndrome generators 30S1-30S9 have different numbers of inputs (specifically 51, 59, 59, 59, 55, 59, 60, 47, and 56 respectively) to optimize the interconnect wiring layout. The three stages of XOR generate the parity of a subset of the one hundred and twenty eight data bits. This generated parity bit is then compared to the stored check bit for that subset. The output bit from the third stage of generator 30S1 is a syndrome bit, which is coupled to a respective line of a 9-bit syndrome bus 32. The inputs to the first stage S1 of each syndrome generator 30S1-30S9 are subsets of the 128 data bits. Each syndrome generator receives a unique set of data bits, in accordance with the error correction code requirements. In other words, these XOR inputs are wired to calculate the parity of selected subsets of the 128 bit data word according to a parity check matrix defining the error correction code used.

When data is to be written into the chip, a data word of 128 bits is written into the SRAM register 40C from the memory chip's I/O pads. This 128 data bit word is driven into the ECC system at the rising edge of the external row enable signal RE to the inputs of 30S1-30S9. The remaining nine inputs of the 30S1-30S9 are held at logical 0. Once the check bits have been generated, they are coupled from the syndrome bus 32 to the data lines of the DRAM via switch SW and inverters 34, and both the 128 data bits and 9 check bits are written back to the DRAM arrays through the data lines DL.

In a fetch operation, the ECW, consisting of 128 data bits with their 9 check bits, is read from the DRAM array as discussed above. This data is sent down 137 data lines DL coupled between the bit lines and the ECC system. Nine check bits are generated from the same subsets of the 128-bit data word as described above. Then, the newly-generated check bits are compared to the check bits previously stored for the 128 data bits when they were originally written into the chip. This is done by carrying out an XOR operation on a bit-by-bit basis at the respective outputs of the syndrome generators (not shown). This results in the generation of nine syndrome bits that indicate an error syndrome address. This syndrome data is driven onto the 9-bit. syndrome bus 32, where its binary value is decoded by 128 NOR devices 36 (one for each data bit) to indicate the position of a bad bit (i.e., which data bit is bad). In the case of no errors within a 137-bit ECW, the newly-generated check bits are the same as the check bits stored when the data bits were originally written, and the resulting syndrome address is 0. In the event of an error, the syndrome bus 32 provides a 9-bit address signal (1/128) that indicates the location of the bad bit, and the NOR decoder 36 at that position generates an error flag bit EB. The outputs of the 128 NOR decoders 36 are XOR'ed with the 128 respective data bits at XOR gates 38 and a data bit is inverted if its associated error bit EB is active. The output of each of the 128 2-input XOR devices 38 drives the 128 bit SRAM register, providing error-free data bits thereto.

While as a practical matter the XOR gates within syndrome generators 30S1-30S9 could be provided using any conventional logic, it is preferred that differential cascode voltage switch (DCVS) logic be utilized. DCVS is described in detail in U.S. Pat. No. 4,570,084, issued 2/86 to Griffin et al, the teachings of which are incorporated herein by reference). FIG. 7 is a circuit diagram of a DCVS 4-input XOR. Transistors T2 through T15 form the N-type combinational logic of a 4-input XOR function with differential inputs AT, AC to DT, DC. When phase PC is driven high, differential output of the XOR of differential inputs A,B,C and D is driven to nodes QT and QC by inverters formed by T16, T17, T20 and T21. Leakage protection is provided by soft latching action of T18 and T22.

DCVS logic is utilized because it provides both fast switching speeds and enhanced testability. The total delay from receipt of the input data bits by the first stage S1 to transmission of the corrected data to the SRAM is on the order of 5 nsec. As pointed out in the Jawala paper, one of the major reasons why on-chip ECC has not been used in the past was because it added too much delay to the overall access cycle. By utilizing DCVS logic, the ECC circuitry of the invention reduces this delay to the point where the yield/correction benefits of ECC can be achieved without substantial access penalty. Moreover, 100% testability of the ECC logic is possible. As shown in FIGS. 5-6, the 9 check bits can be separately accessed through a portion 40D of the SRAM 40. As shown in FIG. 5, during a test cycle the position of switch SW can be changed, such that test check bits can be written directly from SRAM 40D onto the data lines DL, bypassing the generated check bits on syndrome bus 32. By setting the check bits externally for different combinations (test vectors) of data bits, the DRAM cells can be tested separately, without involving the ECC logic system. Rapid testing of the ECC logic is also possible due to the unique properties of the fail modes of DCVS logic. The outputs of the logic gates are both '0' until set, then one and only one output will assume a '1'. Fails in the logic create either a double '1' or double '0' output, which propagates thru the logic, making fault detection easy.

Having described the ECC block 30, the redundancy systems of the invention will now be described with reference to FIGS. 8-12.

Figure 15:
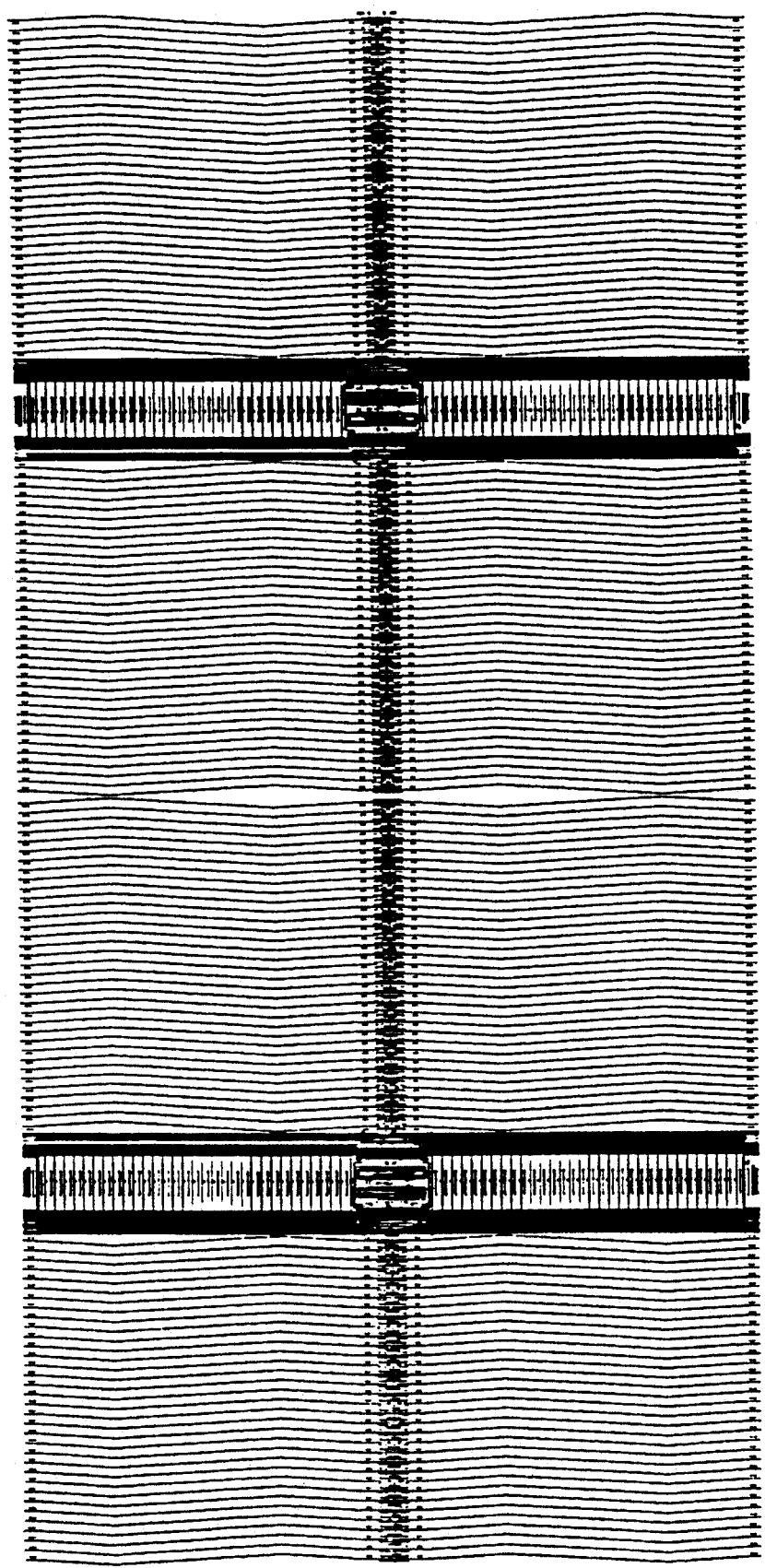
FIG. 15 is a top view of a portion of the memory arrays of FIG. 1, showing the layout of the pre-data lines of the invention.
Figure 16:
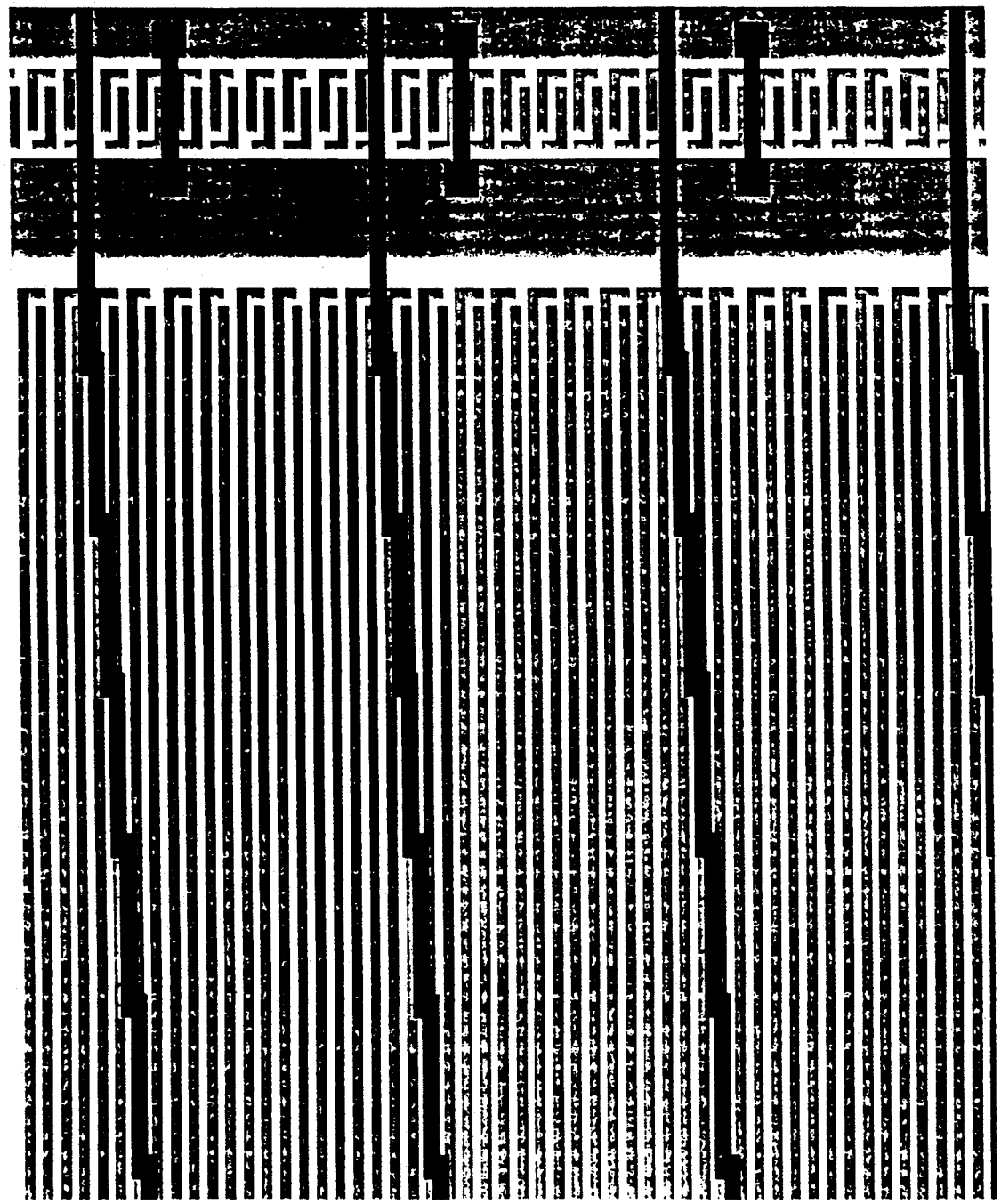
FIG. 16 is an enlarged view of a portion of the memory array of FIG. 15.

Before describing the operation of the bit line redundancy, it is necessary to understand the arrangement of the data lines of the invention. Heretofore, the data lines have been simply referred to as lines that interconnect the bit lines of the array to the inputs to the ECC system. In practice, however, the data lines are actually split into three components—the pre-data lines (PDLs), the middle data lines (MDLs), and the full data lines (DLs). The PDLs are coupled to the bit lines in the array; the MDLs receive a combination of the PDLs and redundant PDLs, and the DLs receive either the MDLs or the bit lines from the word line redundancy, and are coupled to the inputs to the ECC system. Physically, the PDLs are formed in second level metal over the memory arrays. They have to be perpendicular to the selected wordline; parallel to the first metal bit lines. If the PDLs are straight, one metal bit line will have a large capacitive coupling to the PDL. While as a practical matter the PDLs do not change state while the memory cells in the underlying arrays are being sensed, the D.C. parasitic alone is enough to disturb the sense amp, especially if the added load is not balanced. To limit the capacitive coupling to a given bit line, PDLs are zig-zagged across the array. Because the length of the PDL crossing a segment is so large relative to the PDL spacing, the PDLs cross the bit lines at only a 3 degree angle. Therefore, there is almost no increase in the length of these lines. But the worst case loading is one sixteenth of what it was, the loading is balanced on both bit lines, and the coupling is alignment insensitive. This is shown in FIG. 15 (PDLs for an entire segment) and FIG. 16 (expanded view of FIG. 15—the light lines are the M1 bit lines, and the dark lines are the PDLs) Note that the MDLs are formed between the PDL switches and the DLs, and the DLs are formed between the MDL switches and the ECC. Thus, the three sets of data lines with their associated switches follow the pipelined layout of the logic blocks, so that they are also laid out in a generally pipelined fashion.

As previously discussed, each quadrant is 1112 bit line pairs wide. Of these, sixteen bitline pairs are redundant pairs which are replaced two blocks at a time resulting in 32 redundant bit line pair elements.

Figure 8:
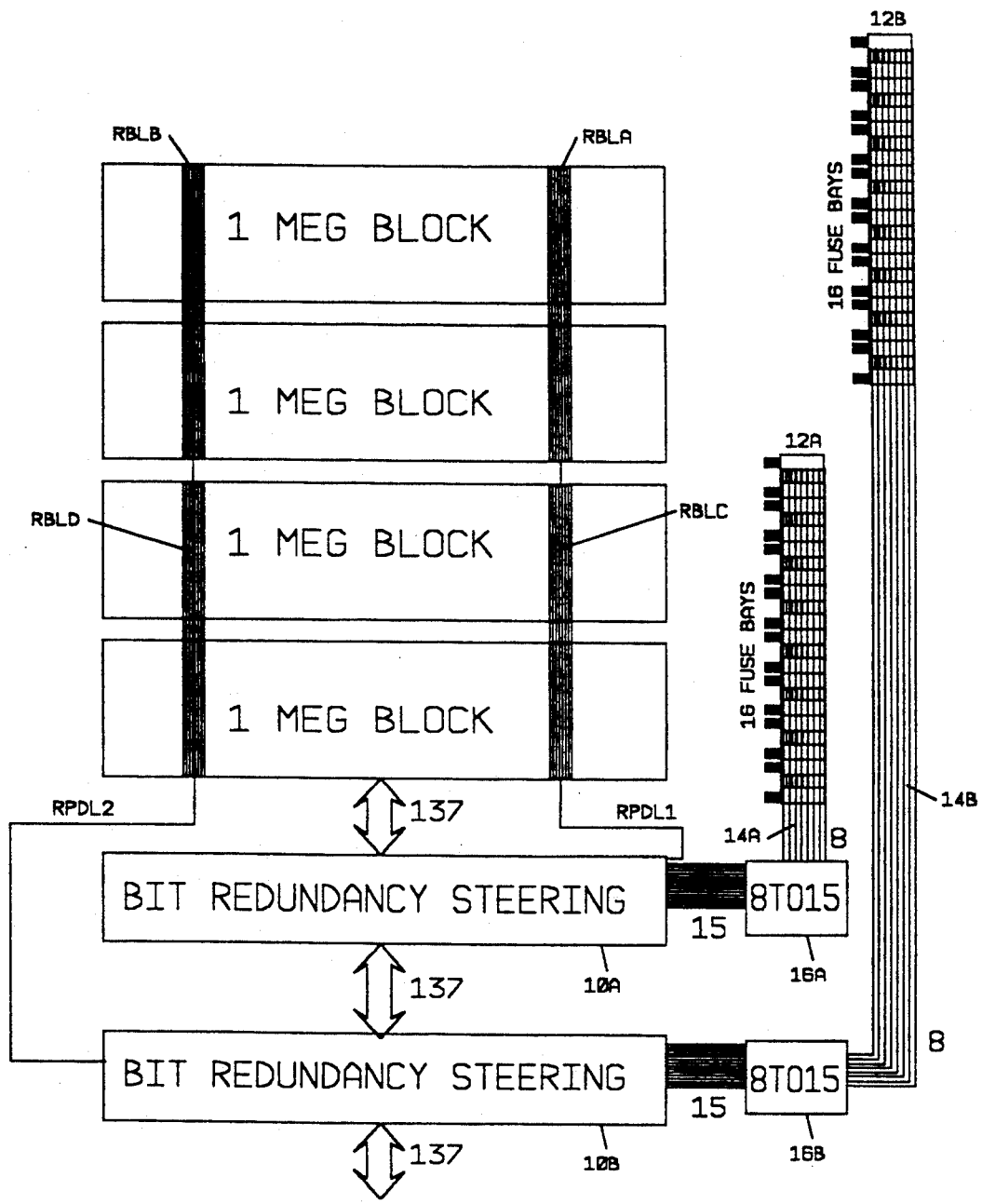
FIG. 8 is a block diagram of the bit redundancy system of the invention.

FIG. 8 is a block diagram of the bit redundancy system. The four blocks RBLA, RBLB, RBLC, and RBLD are groups of eight redundant bit lines shared by adjacent blocks. Note that the blocks of redundant bit lines are physically located remote from each other in their respective array blocks. This is done t maximize the reliability of the bit line redundancy; if one group of bit line redundant cells are faulty due to pattern defects, etc., the chances that the other group will fail to operate due to the same defects is minimized.

Each quadrant has 139 PDLs. Of these, 137 support the ECW (128 data bits, 9 check bits), and 2 support bit line redundancy. As shown in FIG. 8, the two redundant PDLs, RPDL1, RPDL2 are also disposed remote from each other.

Each quadrant also has banks of fuses. There are 32 fuse banks, two for each pair of redundant bit lines. Each fuse bank has eight fuses. The banks are shown in FIG. 8 as elements 12A, 12B.

The bit redundancy works as follows. When a bad bit line is detected during test, the fuse bank for the applicable redundant bit line (having the same general location on the same side of the same block) will be programmed so as to replace the bad bit line. In the prior art, this is done by programming the fuses to replicate the address of the bad bit line. In the present invention, the identity of the programmed fuse bank itself indicates the address of the bit line to be replaced. The fuse bank is hard wired to receive the bit address signals. When the received bit address signals are at the selected logic states, the selected fuse bay is read out. The logic state blown into the fuses indicates the address of the PDL to which the bad bit line is coupled. Note that this operation occurs for every cycle, whether or not the designated bit line is bad. In the case where the designated bit line is not bad, the applicable fuse bank will be unprogrammed. As shown in FIG. 8, when the received address is for the bad bit line, the states of the fuses of the applicable fuse bay are transmitted over the eight output lines 14A, 14B to bit redundancy predecoders 16A, 16B, which convert the eight fuse signals into 15 predecoded output signals for decoding by the bit redundancy steering blocks 10A, 10B.

Figure 9:
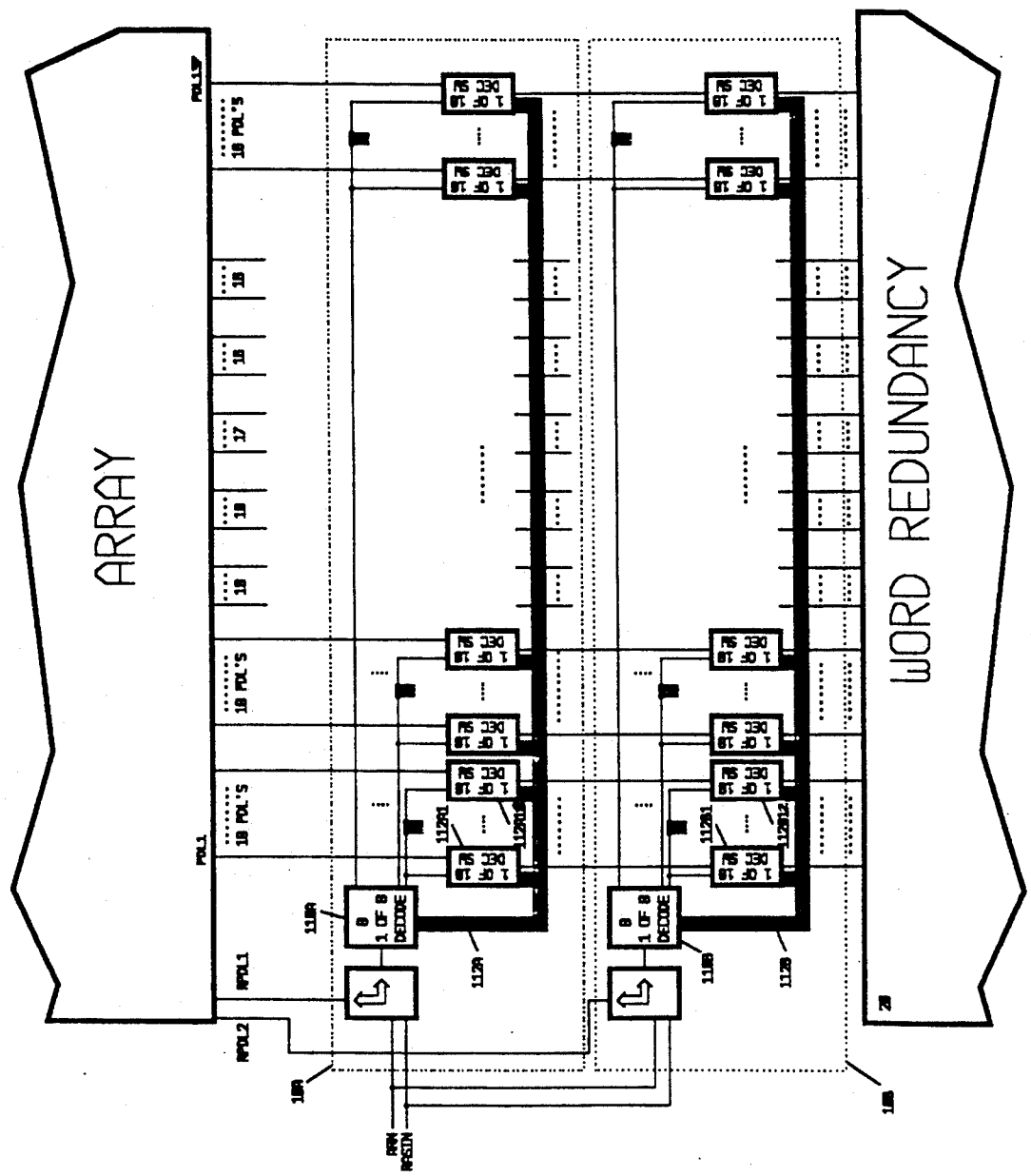
FIG. 9 is a block diagram of the switch network for interconnecting the PDLs and the redundant PDLs to the MDLs on an any-for-any basis.

FIG. 9 is a detailed block diagram of steering blocks 10A, 10B. Each steering block features two sets of decoders. The first decoder 110A, 110B for each block 10A, 10B provides a ⅛ decode, and a second set of decoders 112A, 112B for each block 10A, 10B performs a 1/16 decode. In the second set of decoders there are 137 individual decoders (e.g. 112A1, 112A2, etc.) one for each PDL. These decoders are broken down into four groups of 18 each, one group of 17 and three groups of 16 each. The first decoder 110A, receives six of the fifteen decoded signals from the predecoder 16A to decode which of the eight groups of decoders 112A are to be addressed. The decoders 112A within the selected group receive combinations of all 15 decoded address signals from predecoder 16A, to select one of the predecoders (of the 137) such that it falls in the correct group. If a given predecoder is selected, it will turn on to disconnect the applicable MDL from the selected PDL, and will substitute the redundant PDL in its place. Thus, the bit line redundancy of the invention can replace any bit line in the array, with a minimum of overhead and access delay, by simply switching a redundant PDL for the PDL coupled to the faulty bit line.

Figure 10:
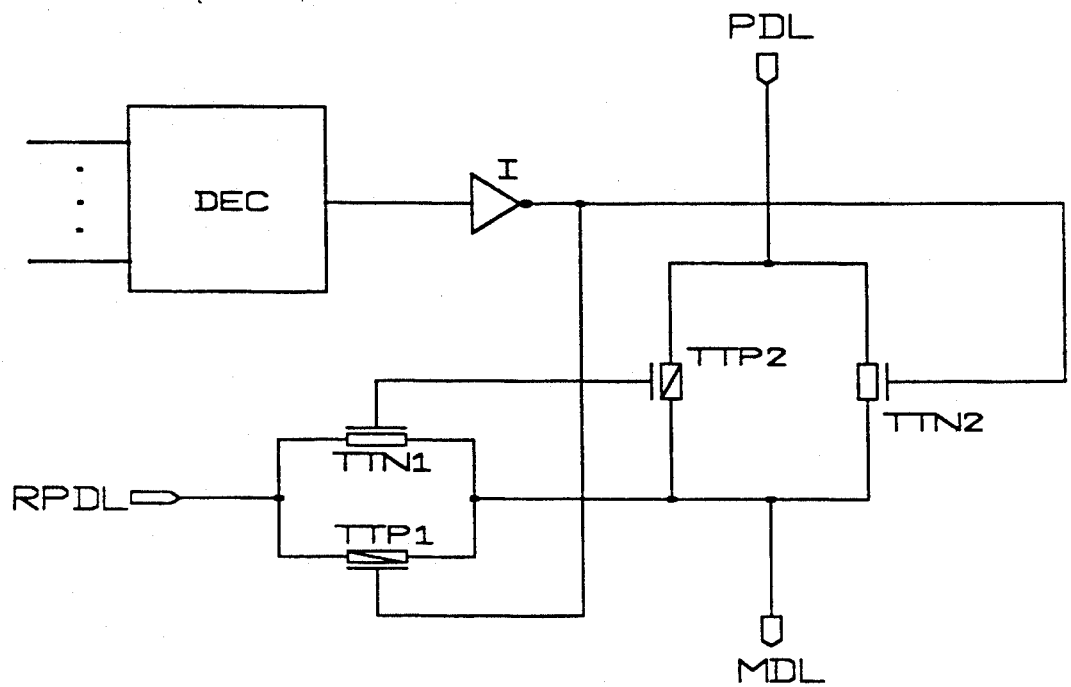
FIG. 10 is a circuit diagram of the switch circuit utilized in FIG. 9.

One of the decoders 121A1 is shown in detail in FIG. 10. The block labeled DEC provides the decode function previously described. When the output of DEC is high (indicating that decoder 112A1 has been selected), the redundant PDL (RPDL) is to be coupled to MDL. Thus, when DEC is high the transistors TTN1 and TTP1 turn on, passing RPDL to the MDL input. If DEC is low, redundancy is not invoked, and TTN1 and TTP1 stay off while TTN2 and TTP2 turn on, coupling PDL to the MDL input.

With the bit redundancy system as described above, the 137 MDLs pass through the word redundancy system 20 prior to being inputted to the ECC 30. The word redundancy system will now be described with reference to FIGS. 11-13.

The word redundancy array 20 consists of 24 W/Ls by 1096 B/L pairs that operate independently of the DRAM array. The array incorporates a twin cell architecture that stores both true and complement data. The small size of the array makes the added cost for two cell area small compared to the support circuitry.

By forming the redundant word line array in an area of the chip removed from the main memory array, reliability is improved because the redundant arrays will be more immune to pattern defects, etc. occurring in the memory array. This is especially important for use with an ECC system, because use of ECC increases the relative impact of word redundancy having poor yield. Moreover, because the redundant word lines are not formed in a particular segment of the quadrant, they can replace any failing word line in the quadrant.

Figure 11:
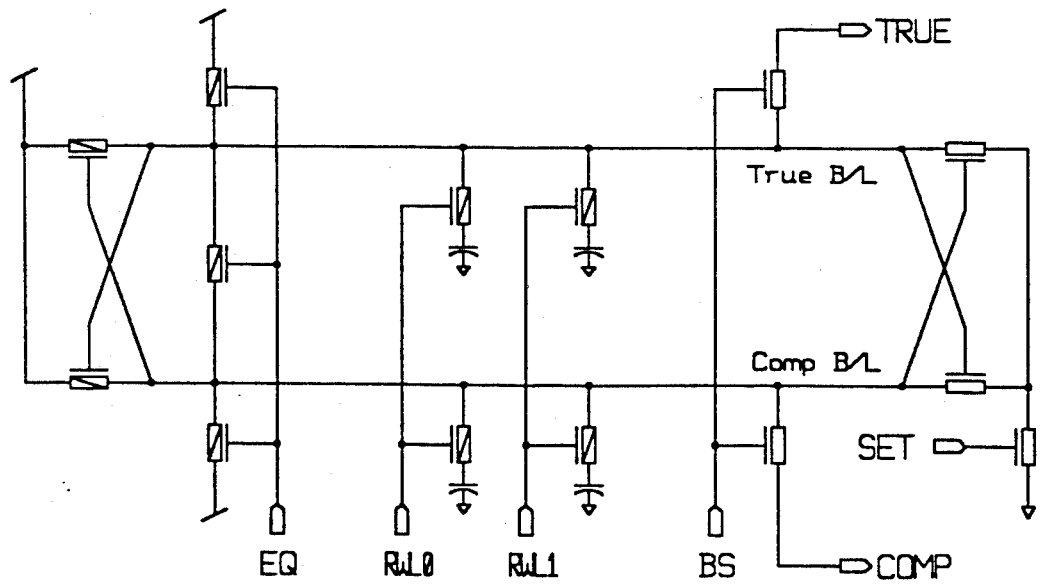
FIG. 11 is a circuit diagram of a bit line pair of the word line redundancy array of the invention.

Another aspect of the word redundancy system that has been optimized for use with on-chip ECC is the use of a twin-cell array. As shown in FIG. 11, each redundant word line RWL0, RWL1 is coupled to a memory cell on each bit line. Thus, each word line is coupled to memory cells storing both high and low states. When a given word line is selected, it turns on to set the respective bit lines at these high, low values. Note that this is different from the main memory array, wherein dummy cells are used to establish a comparison voltage. Because the twin cell layout provides a full "1" and a full "0" to the sense amplifier, the chances that the sense amp will sense the respective states incorrectly are minimized. At the same time, because full logic levels are presented for sensing, it takes less time for the sense amp to set; at the same time, because the array is only 24 W/L deep, the bit lines are extremely small, providing a high bit line transfer ratio that even further enhances the sensing operation.

Figure 12:
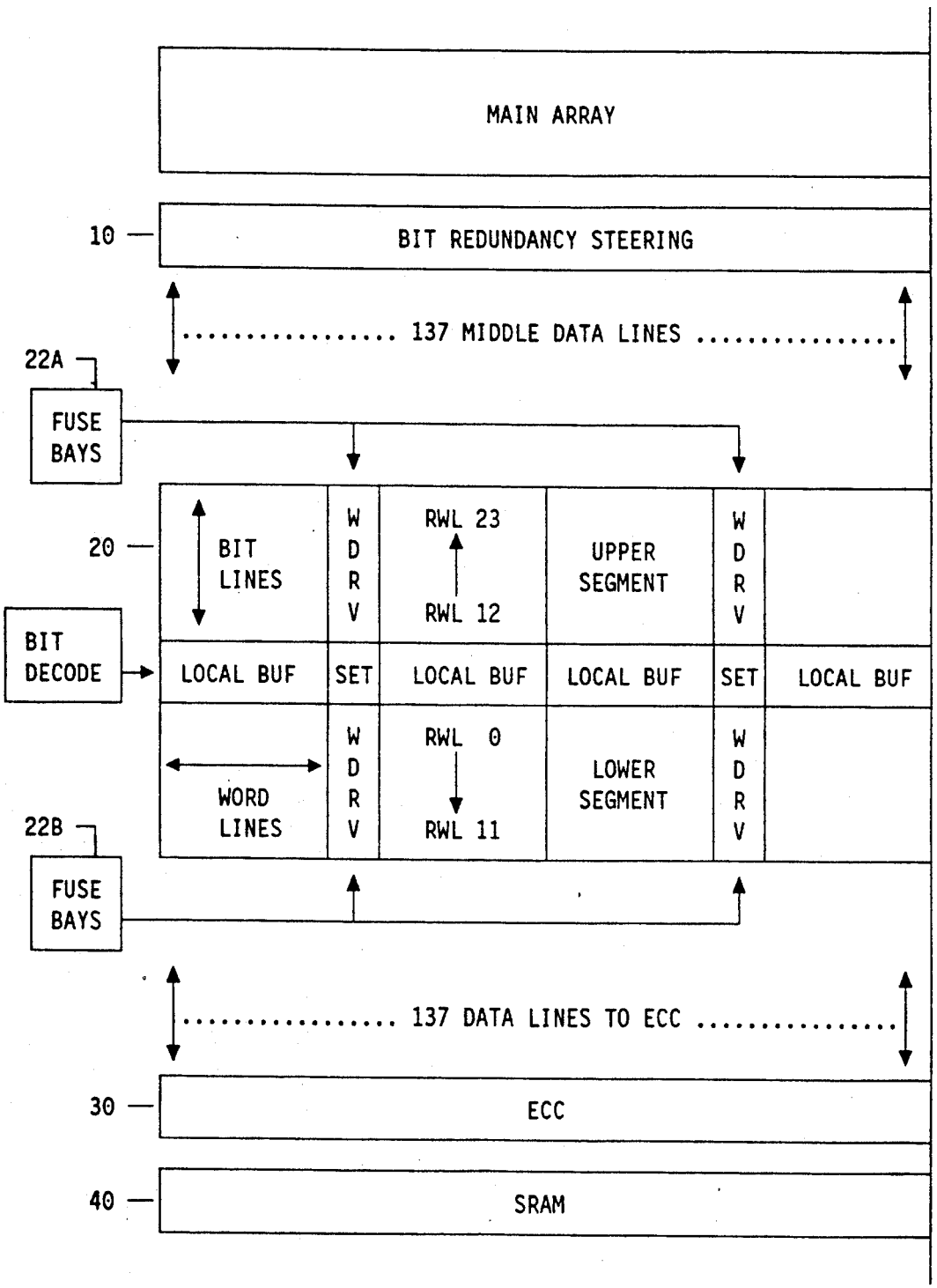
FIG. 12 is a block diagram of the word line redundancy array of the invention.

Other than the features discussed above, the specific manner in which the redundant word line array operates is akin to conventional arrangements. As shown in FIG. 12, the address of a defective word line (W/L) is stored in one of the 24 Fuse Bays 22A, 22B that is dedicated to a W/L in the redundant array. The Fuse Bay determines if the W/L being addressed in the memory array should be replaced. This is done by comparing the row address with the address stored in the Bay. If the addresses match, the redundant W/L is used to replace the W/L selected in the main array, any fuse bay can be programmed such that the corresponding redundant W/L can replace any of the 4096 W/Ls in the quadrant. Subsequently, during the CAS cycle the same bit line decode is carried out as in the memory arrays, to select one of the bit lines within the redundancy array. As a function of this decode, signal BS rises coupling the 137 bit lines from the word redundancy array to the inputs to the data line DL inputs to ECC 30. A switching network akin to the switch shown in FIG. 10 for bit line redundancy substitution could be used to switch the DL inputs between the MDL outputs and the bit lines of the redundancy array. The switch can be controlled by an auxiliary signal that indicates whether or not a redundant word line has been activated.

In the invention, the combination of optimized redundant circuits and on-chip error correcting code circuits leads to a fault-tolerance synergism. This synergism results because the redundant circuits are used to circumvent the major limitation to the use of error correcting codes, which is the occurrence of more than one failing bit in an ECW, such that the odd-weight DED/SEC code cannot correct the ECW. One of the ways to circumvent this problem is to utilize interdigitated bit lines, wherein adjacent bit lines/cells are elements of different ECWs (thus, if adjacent bit lines/cells fail, they will be single errors in different ECC words, rather than a double error in one). In the invention, eight adjacent bit line pairs/cells along a word line correspond to different ECWs. Calculations of the probability of more than one fault occurring in these 137-bit ECWs indicate that with 428 randomly failing cells in a 16 Mbit memory, there is a better than 50% chance that two such failing cells will not occur in the same error correcting code word of 137 bits, and thus the chip can be corrected with ECC alone. The yield associated with all these defects would therefore be more than 50%. Nevertheless when there are 1000 randomly failing cells on a chip, the chance for nonalignment of cells in any error correcting code word is less than 2%, thus representing a 2% yield.

In the chip described here, the error correction affects only a single failing bit in an error correcting code word. Any additional faults in an error correcting code word must be fixed with redundancy or else the chip will fail. In order to optimize the fault tolerance of a chip with error correction, it is necessary to replace the multiple faults in an error correcting code word in a systematic way. The first step in achieving this is by the use of the bit line redundancy of the invention, wherein two blocks within each quadrant have their own redundant bit lines that can substitute any defective bit therein. Based on computer simulations and theoretical calculations, the fault tolerance of the ECC increases dramatically by this use of the redundant bit lines of the invention.

Figure 13:
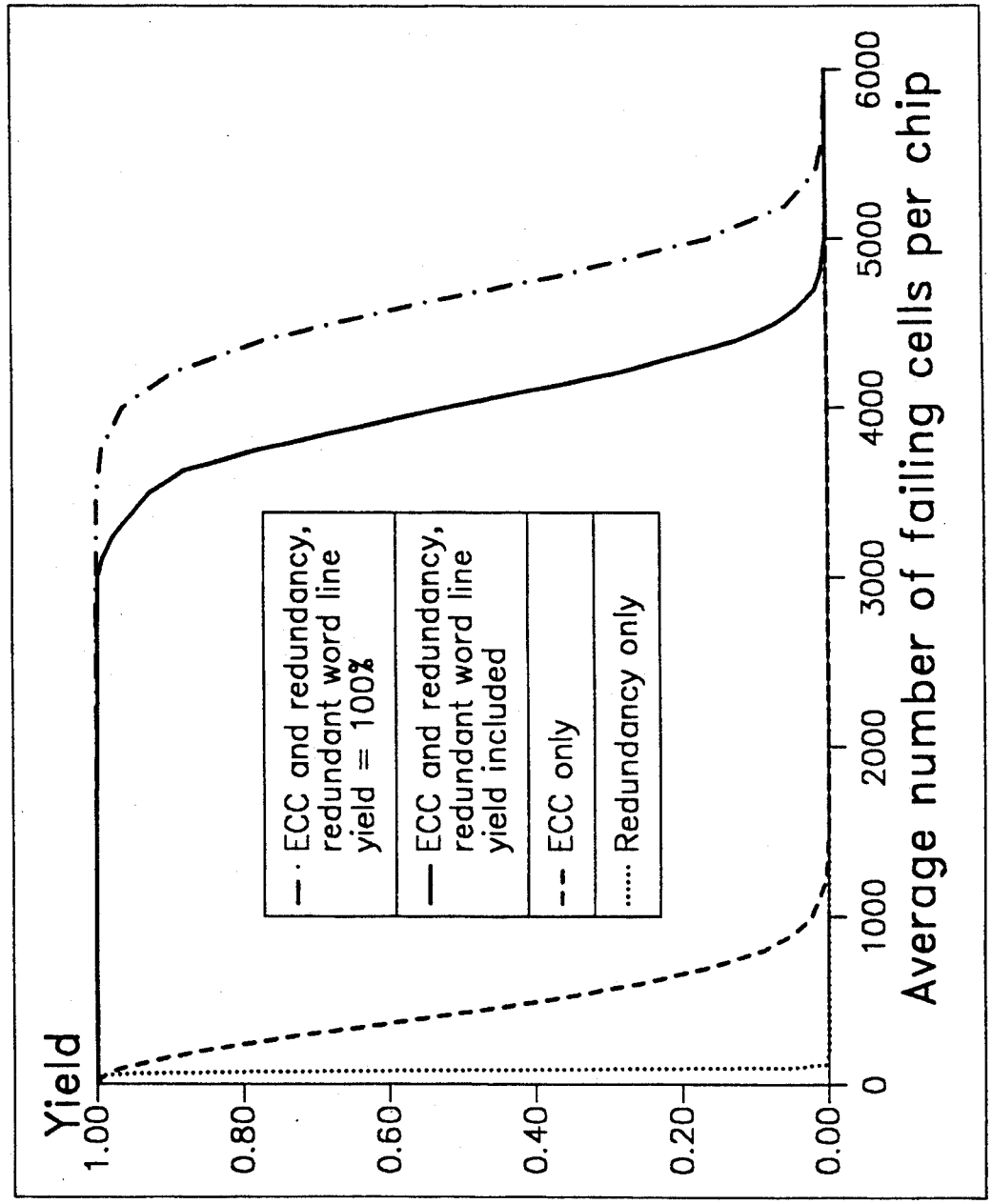
FIG. 13 is a graph of the yield versus the average number of single cell fails for different error memory recovery techniques, including that of the present invention.

As shown in FIG. 13, without the use of the error correcting code circuits, (i.e. using redundant bit lines only), an average of 28 randomly failing single cells per chip would result in an expected yield of 50% for a 16 Mb chip. Using the error correcting code circuits only, with no bit line redundancy, results in a 50% yield for an average of 428 random single cell failures per chip, as previously described. Combined use of the bit line redundancy of the invention and error correcting code produces a 50% yield at an average of 2725 randomly failing single cells per chip. It was also found theoretically that the fault tolerance increase depended sharply on the number of redundant bit lines per segment. Hence, while two redundant bit lines per segment is given by way of example, as a practical matter more lines could be added to increase the reliability results. In the invention two redundant bit lines were used because even greater fault tolerance optimization could be achieved by the use of the redundant word line techniques of the invention.

As described above, the chip is divided in four quadrants, each having a separate array of 24 redundant word lines. Thus, a given redundant word line can replace eight error correcting code words if they contain multiple defects, and can do it more reliably (i.e. with less of a chance of providing new ECWs that incorporate double errors) due to the use of a separate array and the use of the twin cell word line technique. It is this capability that gives the word line redundancy even more of a synergistic effect than the bit line redundancy. This is caused by the elimination of multiple fault alignments on the word lines. The resulting yields are shown in the third curve of FIG. 13. The results are affected by the yield of the redundant word lines. If the yield of the redundant word lines is assumed to be the same as that of the regular word lines, the 50% yield point occurs at an average of 4016 random single cell failures. However, in this chip the redundant word lines use a twin cell technology in a separate array to make them less sensitive to defects than the regular word lines. Assuming 100% yield for these redundant lines results in a 50% yield point at an average of 5661 random single cell failures per chip. Thus, the use of both bit line and word line redundancy optimized for on-chip ECC results in a 50% yield point more than a magnitude greater than the 50% yield point achieved by ECC alone. As a practical matter, this greatly enhances yields early in the production cycle when functional parts are needed most, while also enhancing the field-fail immunity of the chip. Given the complexity/expense of the manufacturing processes of these chips, this increase in yield/reliability is of vital importance.

Figure 14:
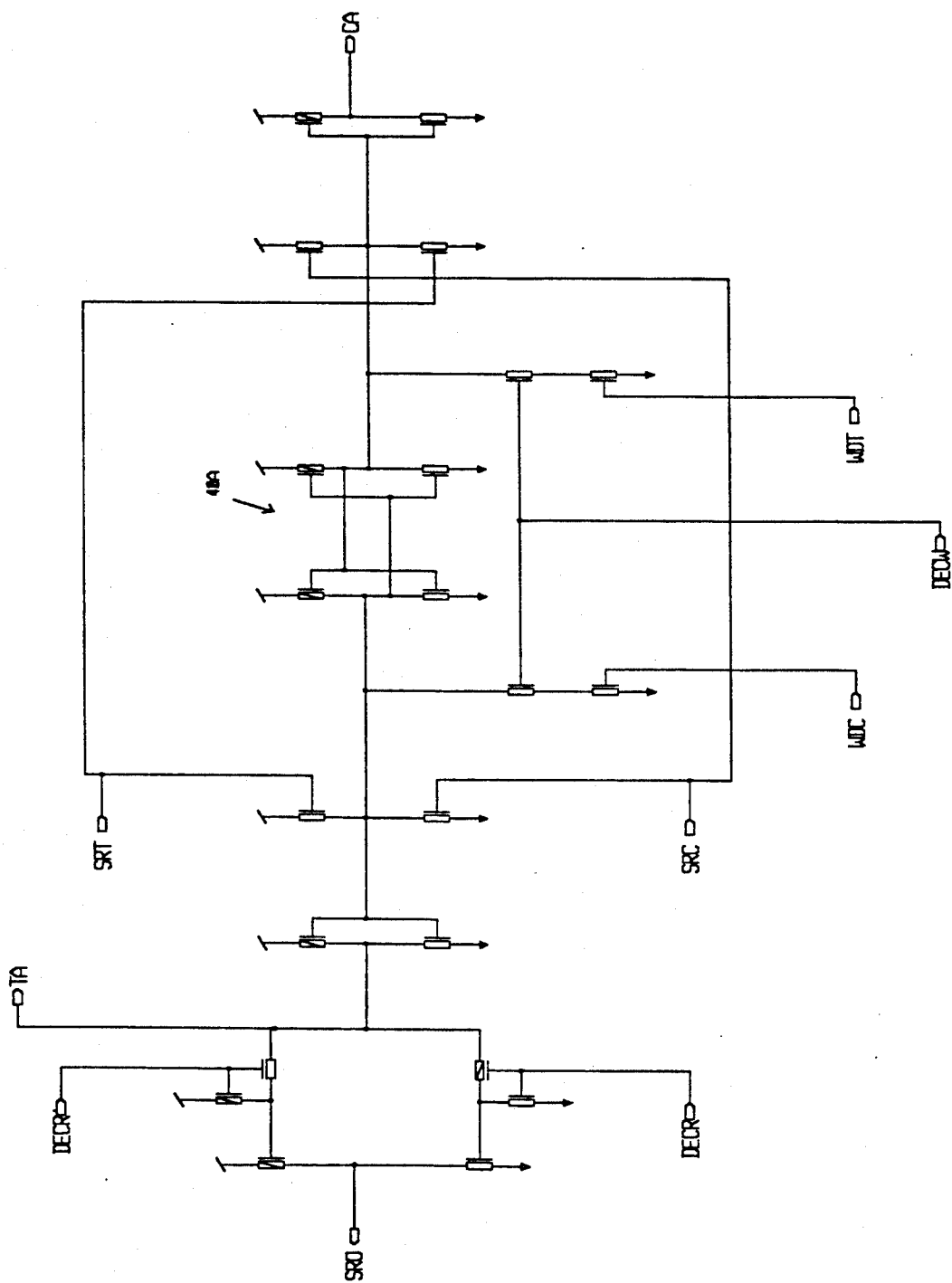
FIG. 14 is a circuit diagram of one of the SRAM cells of the invention along with read/write support circuitry.

Once the data bits are corrected by the ECC 30, the corrected ECW is passed to the SRAM 40. The SRAM is a 1×144 bit data register, wherein each SRAM cell is a conventional 4-device cross-coupled latch, (40A in FIG. 14). As shown in FIG. 14, the logic state stored by the SRAM cell can be set from two different sources: from off-chip (via WDC and WDT) or from the ECC outputs (via SRT and SRC). Moreover, the cell can provide data to two destinations: either the ECC (via output CA and TA) or the output pins (via output SRO). The SRAM cells are broken up into two groups of 72 cells. As shown in FIG. 4, a decoder 84 determines which of the 72 cells in each group are to be accessed when reading/writing data from/to to the output pins (in FIG. 14, the decode during the write cycle is DECW; during the read cycle, DECR and DECR').

While the SRAM is used principally as a means of accessing ECWs, it provides additional advantages that serve to lessen the access/area penalties of the on-chip ECC system. Because 128 data bits are available in memory adjacent to the output pins, multi-bit output modes such as page mode, static column mode, and the access mode described in the aforementioned U.S. Pat. No. 4,845,664 IBM patent, can be carried out at extremely high data rates. Another operation mode that can be accomplished with the aid of an SRAM is a page clear mode. During a write cycle the entire SRAM is written to the data state present at the I/O pad. This data is then written back to the array wherein the address at RE time indicates the selected word line and the address at CAS time indicates the selected ECW. In this manner, due to the non-contiguous (interdigated) bit locations of a page, high speed data pattern writing is performed. If, while the chip is still in the page clear function a read cycle is performed, the data from the array is fetched to the SRAM and the entire 128 data bits are compared to each other. Thus offering a 128× reduction in test time. This is for only one quadrant of the chip (4 Meg). The test time reduction for the chip is 128×4 or a 512× reduction.

With reference to FIG. 3, the data I/O block 40C includes a rate-controlled off-chip driver (OCD) that supports the fast data rates resulting from the operating modes discussed above. At the same time, the OCD should have a high degree of immunity to current surges resulting from the large number of different data wiring nets used on memory cards. While any OCD designs that possess the foregoing attributes could be utilized here, it is preferred to use the OCD design described in U.S. Pat. No. 5,015,880, entitled "CMOS Driver Circuit," filed Oct. 10, 1989 by Drake et al and assigned to IBM. While the operational modes discussed above can be set using conventional means, in the invention they are set electronically, such that a single silicon part number supports mulitple operational modes. The chip powers up in a default mode depending on the package it is placed in, and can be put into any other of its operational modes, that is toggle, fast page, static column, by simply monitoring the address inputs when CE and WE are active before RE occurs. Note that this feature permits the memory chip to be operated in more than one mode (to the extent compatible, e.g. static column mode and clear page) at the same time. Mode address decoders monitor the address signals, and a particular operational mode is selected if a respective mode address decoder receives the correct address. The activated decoder will provide a control signal to the data I/O and mux 40C of FIG. 3 to control its operation as a function of the selected operational mode. This electrical programming of the operational mode does not adversely impact chip size, power or performance. This feature provides cost and time savings due to the fact only one chip silicon part is designed, characterized, manufactured, stocked, tested, etc. The part is totally tested for all pattern sensitivities of the array which is the vast majority of test time with only a short test to verify operational modes since these modes are only logic that interface the pads to the static register.

In summary, a DRAM architecture has been described wherein both bit line and word line redundancy have been optimized to support on-chip ECC. While the optimization of these redundancy systems was motivated by on-chip ECC, in practice either one or both systems could provide the same general advantages in supporting conventional system-level ECC. The word line redundancy of the invention maximized differential signal by use of a twin cell technique; as a practical matter, any other means of driving the respective bit lines of the word line redundancy system to full rail potentials could be used, e.g. by using SRAM cells. Moreover, while in the invention a SEC/DED odd-weight Hamming code was specified, any sort of error correction coding could be used.

As previously discussed, the error recovery system of the invention can be used to correct for both initial hard fails, and either soft and hard fails subsequently occurring in the field. However, it is possible that over time the defect learning of the semiconductor process may reach a point where the yield of good bits is high enough so that the remaining bad bits can be fixed by the redundancy system alone. Should this occur, it may be desirable to remove the on-chip ECC circuitry, and use the remaining support circuitry (e.g. SRAM, etc.) to carry out ECC at the system level, while still obtaining the high data rates and efficient copy/test modes afforded by having the ECW resident in the SRAM. The architecture of the invention supports easy removal of the ECC block. As shown in FIG. 1, notice how each ECC block 30 for the respective quadrants is formed in an area of the chip where no other circuitry is formed; moreover, note that adjacent ECC blocks are formed in a rectangular area of the chip that extends from one long side to the other long side thereof. Thus, the ECC block 20 could be completely removed (and the MDL outputs coupled directly to the SRAM inputs) without disturbing any of the other support circuitry. This would provide a significant savings in chip real estate at minimum redesign cost.

What is claimed is:

1. A memory, comprising: a first array of memory cells having a first plurality of word lines, a first plurality of bit lines, and a first plurality of redundant bit lines; a first plurality of data lines; switching means for coupling selected ones of said plurality of redundant bit lines of said first array and selected ones of said plurality of bit lines of said first array to said first plurality of data lines; a separate array of redundant memory cells comprising a second plurality of word lines and a second plurality of bit lines; address means coupled to said first plurality of word lines of said first array of memory cells and to said second plurality of word lines of said separate array of redundant memory cells for accessing an X-bit error correction word comprising data bits and check bits from one of said first array of memory cells and said separate array of redundant memory cells; error correction circuitry coupled to said first plurality of data lines and to said plurality of bit lines of said separate array of redundant memory cells, for reading said accessed X-bit error correction word from one of said first plurality of data lines and said separate array of redundant memory cells and correcting any faulty data bits therein; and output means coupled to said error correction circuitry for providing said data bits as said accessed X-bit error correction word as corrected by said error correction circuitry for external read-out.

2. The memory as recited in claim 1, further comprising a second plurality of data lines having X+N data lines, wherein a first group X of said second plurality of data lines are selectively coupled to said plurality of bit lines of said first array, and wherein a second group N of said second plurality of data lines are selectively coupled to said plurality of redundant bit lines of said first array.

3. The memory as recited in claim 2, wherein said first group X of said second plurality of data lines are coupled to said first plurality of data lines by said switching means, and wherein said switching means couples one of said second group N of said second plurality of data lines to one of said first plurality of data lines if one of said first group X of said second plurality of data lines is coupled to a faulty one of said plurality of bit lines of said first array of memory cells.

4. The memory as recited in claim 3, further comprising a second switching means for coupling bit lines of said separate array of redundant memory cells to said error correction means when a word line of said first array addressed by said addressing means is faulty.

5. The memory as recited in claim 2, wherein said second plurality of data lines are disposed above said plurality of bit lines of said first array of memory cells in a zig-zag pattern relative to said plurality of bit lines of said first array of memory cells to minimize capacitive coupling thereto.

6. The memory as recited in claim 1, wherein said error correction circuitry comprises a plurality of syndrome generators, and a syndrome bus coupled to said plurality of syndrome generators for receiving respective syndrome bits therefrom.

7. The memory as recited in claim 6, wherein said error correction circuitry is comprised of differential cascode voltage switch XOR logic gates.

8. The memory as recited in claim 6, wherein during a writeback cycle respective parity bits are generated by said plurality of syndrome generators and stored as check bits of said error correction word.

9. The memory as recited in claim 8, wherein said plurality of syndrome generators compare said stored check bits of said error correction word with respective check bits generated by said plurality of syndrome generators for said data bits of said error correction word during a fetch cycle, to generate respective syndrome bits.

10. The memory as recited in claim 9, further comprising means coupled to said plurality of syndrome generators for determining which of said data bits of said error correction word are in error, and means for inverting one of said data bits.

11. The memory as recited in claim 10, wherein said determining means is comprised of a plurality of differential cascode voltage switch XOR gates.

12. The memory as recited in claim 1, wherein said memory is formed on a rectangular portion of a semiconductor chip, said rectangular portion having two long sides, and wherein said error correction circuitry is disposed on an area of said semiconductor chip that extends between said two long sides of said rectangular portion of said semiconductor chip, said area of said semiconductor chip having no other circuitry associated therewith.

13. The memory as recited in claim 1, wherein said output means comprises a buffer that stores both of said data bits and said check bits of said error correction word.

14. The memory as recited in claim 13, wherein said output means further comprises means for addressing at least one of said data bits stored in said buffer, and at least one I/O means for receiving said at least one of said data bits for data transmission.

15. An architecture for at least part of an integrated circuit chip, comprising:
   an array of memory cells disposed on a first portion of the integrated circuit chip, comprising a plurality of word lines, a plurality of bit lines, a first plurality of memory cells, each of said first plurality of memory cells being coupled to one of said plurality of word lines and to one of said plurality of bit lines, a plurality of redundant bit lines, and a second plurality of memory cells, each of said second plurality of memory cells being coupled to one of said plurality of word lines and one of said plurality of redundant bit lines;
   a first plurality of data lines;
   switching means for coupling selected ones of said plurality of redundant bit lines and said plurality of bit lines to said first plurality of data lines;
   an independent word line redundancy array disposed on a second portion of the integrated circuit chip spaced from said first portion, said independent word line redundancy array having a plurality of word lines and a plurality of bit lines;
   an error detection and correction means coupled to said first plurality of data lines and to said plurality of bit lines of said independent word line redundancy array for reading and correcting an error correction word comprising a plurality of data bits and a plurality of check bits; and
   a buffer coupled to said error detection and correction means for temporarily storing said error correction word.

16. The integrated circuit chip architecture of claim 15, wherein said independent redundant word line array is comprised of twin cell redundant word lines.

17. The integrated circuit chip architecture of claim 15, wherein said plurality of arrays of memory cells, said switching means, said independent word line redundancy array, said error detection and correction means, and said buffer are disposed in a pipelined fashion on said integrated circuit chip.

18. The integrated circuit chip architecture as recited in claim 15, wherein said error detection and correction means generates said check bits in accordance with a double error detect, single error correct error correction code.

19. The integrated circuit chip architecture as recited in claim 18, wherein said error detection and correction comprises a plurality of DCVS XOR logic gates.

20. The integrated circuit chip architecture as recited in claim 15, wherein said buffer further comprises output means for selecting at least some of said plurality of data bits stored by said buffer.

21. The integrated circuit chip architecture as recited in claim 20, further comprising decoding means for decoding mode address signals to set an operating mode of the integrated circuit chip.

22. The integrated circuit chip architecture as recited in claim 21, wherein said output means selects said data bits in a manner established by said decoding means.

23. The integrated circuit chip architecture as recited in claim 22, wherein said buffer sends one of said data bits to an I/O pad during a given access cycle.

24. The integrated circuit chip architecture as recited in claim 22, wherein said buffer sends two of said data bits to two I/O pads, respectively, during a given access cycle.

25. The integrated circuit chip architecture as recited in claim 22, wherein said buffer sends two of said data bits in a sequential fashion to an I/O pad during a given access cycle.

26. In a manufacturing process for forming wafers having a plurality of memory chips thereon, each of the memory chips comprising both a number X of memory cells and a number Y of redundant cells, wherein wafers successively formed by the manufacturing process have an average number N of faulty memory cells, and support circuitry for writing data into and reading data out of the memory chip, the improvement comprising the steps of:
 forming an error correction code circuit block in the support circuitry of each memory chip when said average number N of faulty memory cells in wafers successively formed by said manufacturing process is greater than said number Y of redundant cells, and
 when said average number N of faulty memory cells in wafers successively formed by said manufacturing process is equal to or less than the number Y of redundant cells, forming the wafers without forming said error correction code circuit block in the support circuitry of each memory chip.

27. A memory chip, comprising:
 an array of memory cells interconnected by a plurality of word lines, a first plurality of bit lines, and a plurality of redundant bit lines,
 means coupled to said plurality of word lines, said plurality of bit lines, and said plurality of redundant bit lines for simultaneously addressing a first predetermined number X of said first plurality of bit lines so as to access an X-bit error correction word, while also simultaneously addressing a second predetermined number N of said plurality of redundant bit lines,
 a first set of X+N data lines coupled to at least said first predetermined number X of said first plurality of bit lines and to said second predetermined number N of said plurality of redundant bit lines,
 a second set of X data lines, and
 first switching means for selectively coupling said first set of X+N data lines to said second set of X data lines, so that signals originating from one or more of said second predetermined number N of said plurality of redundant bit lines are sent to said second set of X data lines in place of signals originating from any one or more of said first predetermined number X of said first plurality of bit lines that are faulty.

28. The memory chip as recited in claim 27, further comprising:
 a plurality of redundant word lines having a second plurality of bit lines associated therewith,
 second switching means having a set of inputs coupled to both of said second set of X+N data lines and to said second plurality of bit lines and a set of outputs for transmitting an accessed X-bit error correction word from one of said second set of X+N data lines and said second plurality of bit lines to said set of outputs, and
 a third plurality of data lines coupled to said set of outputs of said second switching means.

29. The memory chip as recited in claim 28, wherein said plurality of redundant word lines are disposed in a portion of the memory chip spaced from said plurality of word lines.

30. The memory chip as recited in claim 28, further comprising:
 means coupled to said third plurality of data lines for providing a Hamming code error checking and correcting function, and a buffer coupled to said means for providing a Hamming code error checking and correcting function for storing both data bits and check bits generated therefrom.

31. The memory chip as recited in claim 28, wherein said first set of X+N data lines, said first switching means, said second set of X data lines, said second switching means, and said third plurality of data lines are arranged in a pipelined fashion on the memory chip.

32. The memory chip as recited in claim 31, wherein said means for providing a Hamming code error checking and correcting function and said buffer are arranged in a pipelined fashion on the memory chip.

33. The memory chip as recited in claim 31, wherein said first set of X+N data lines are disposed in a zig-zag pattern over said first plurality of bit lines so as to minimize capacitive coupling between said first set of X+N data lines and said first plurality of bit lines.

34. A memory chip, comprising:
 a first array of memory cells disposed on a first portion of said memory chip, said memory cells being interconnected by a plurality of bit lines and a plurality of word lines, said array including a plurality of sense amplifiers coupled to said plurality of bit lines to sense a differential signal of a first magnitude therefrom to read said memory cells,
 a second array of redundant cells disposed on a second portion of said memory chip spaced from said first portion thereof, said redundant cells being interconnected by a plurality of bit lines and a plurality of word lines, said second array including a plurality of sense amplifiers coupled to said plurality of bit lines to sense a differential signal of a second magnitude greater than said first magnitude therefrom to read said redundant cells, and first means formed on said memory chip coupled to said first array for reading a multi-bit error correction word from at least one of said plurality of word lines of said first array, said first means being coupled to said second array for reading a multi-bit error correction word from at least one of said plurality of word lines of said second array when said at least one of said word lines of said first array is faulty, said first means detecting and correcting at least one erroneous bit in said multi-bit word.

35. The memory chip as recited in claim 34, wherein said word lines of said second array of redundant cells are coupled to each of said bit lines.

36. The memory chip as recited in claim 35, wherein said second array of redundant cells comprise a twin cell array.

* * * * *